(12) United States Patent
Takeda et al.

(10) Patent No.: US 11,302,719 B2
(45) Date of Patent: Apr. 12, 2022

(54) THIN FILM TRANSISTOR SUBSTRATE AND DISPLAY PANEL

(71) Applicant: Panasonic Liquid Crystal Display Co., Ltd., Himeji (JP)

(72) Inventors: Yugo Takeda, Osaka (JP); Masafumi Hirata, Hyogo (JP); Hiroaki Iwato, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 85 days.

(21) Appl. No.: 16/694,428

(22) Filed: Nov. 25, 2019

(65) Prior Publication Data

US 2020/0176481 A1 Jun. 4, 2020

(30) Foreign Application Priority Data

Dec. 3, 2018 (JP) .............................. JP2018-226609
Dec. 3, 2018 (JP) .............................. JP2018-226784

(51) Int. Cl.
*H01L 27/12* (2006.01)
*G02F 1/136* (2006.01)
*G02F 1/1362* (2006.01)

(52) U.S. Cl.
CPC ...... *H01L 27/124* (2013.01); *G02F 1/136286* (2013.01)

(58) Field of Classification Search
CPC ............. H01L 27/124; G02F 1/136286; G02F 1/13338; G02F 1/134309; G02F 1/1362; G02F 1/1368; G02F 1/1345; G06F 3/0412; G06F 3/0414; G06F 3/04166; G06F 3/0443; G06F 3/0446

USPC ................................................. 257/79; 438/22
See application file for complete search history.

(56) References Cited

U.S. PATENT DOCUMENTS

| | | | |
|---|---|---|---|
| 2008/0018583 A1 | 1/2008 | Knapp et al. | |
| 2010/0188378 A1 | 7/2010 | Chiang et al. | |
| 2014/0285478 A1* | 9/2014 | Ono | G09G 3/3614 345/209 |
| 2016/0093261 A1* | 3/2016 | Kawamura | G09G 3/3648 345/204 |
| 2017/0294172 A1* | 10/2017 | Yang | G06F 3/0412 |

FOREIGN PATENT DOCUMENTS

| | | |
|---|---|---|
| JP | 2008-501138 | 1/2008 |
| WO | 2005/116744 | 12/2005 |

* cited by examiner

*Primary Examiner* — Didarul A Mazumder
(74) *Attorney, Agent, or Firm* — Hamre, Schumann, Mueller & Larson, P.C.

(57) ABSTRACT

A thin film transistor substrate includes: a plurality of gate signal lines extending in a first direction; a plurality of gate lead-out lines and a plurality of dummy gate lead-out lines extending in a second direction; a plurality of common lines extending in at least one of the first direction and the second direction in the pixel region; and a common electrode provided opposite to a pixel electrode and electrically connected to the plurality of common lines. The plurality of gate lead-out lines are connected to the gate signal lines at least at one point of a plurality of intersections between the plurality of gate signal lines and the plurality of gate lead-out lines, and the common potential is applied to the plurality of dummy gate lead-out lines.

10 Claims, 19 Drawing Sheets

THIN FILM TRANSISTOR SUBSTRATE AND DISPLAY PANEL

CROSS-REFERENCE TO RELATED APPLICATION

This application claims priority from Japanese applications JP 2018-226609 filed on Dec. 3, 2018 and JP 2018-226784 filed on Dec. 3, 2018. These Japanese application are incorporated herein by reference.

BACKGROUND

The present disclosure relates to a thin film transistor substrate and a display panel including the thin film transistor substrate.

A display panel such as a liquid crystal display panel and an organic electro luminescence (EL) display panel includes a thin film transistor substrate in which a thin film transistor (TFT) is provided (hereinafter, referred to as a "TFT substrate").

In particular, a display panel of an active matrix driving system includes an active matrix substrate in which the TFT is provided in each pixel of a pixel region is provided as the TFT substrate. For example, the liquid crystal display panel of the active matrix driving system includes the TFT substrate in which the TFT is provided as a switching element in each pixel, a counter substrate opposed to the TFT substrate, and a liquid crystal layer disposed between the TFT substrate and the counter substrate.

In the pixel region of the TFT substrate, a plurality of wiring lines such as gate signal lines and source signal lines are formed in addition to the TFT. A gate driver that supplies a gate signal to the gate signal lines and a source driver that supplies a video signal to the source signal lines are mounted on the TFT substrate.

Examples of a method for mounting the gate driver and the source driver include a COF (Chip On Film) system in which a tape carrier package (TCP) in which the gate driver and the source driver are mounted on a flexible wiring substrate is connected to a frame region of the TFT substrate and a chip on glass (COG) system in which the gate driver and the source driver are directly mounted on the TFT substrate. For this reason, a gate terminal including a plurality of gate terminal electrodes electrically connected to the gate driver and a source terminal including a plurality of source terminal electrodes electrically connected to the source driver are provided in the frame region of the TFT substrate.

Typically, the gate terminal and the source terminal are provided in two sides adjacent to each other in the frame region of the rectangular TFT substrate. However, in recent years, a technique of providing the gate terminal and the source terminal in the same side of the frame region has been proposed in order to narrow the frame of the display panel (for example, see Japanese Translation of PCT Publication No. 2008-501138).

SUMMARY

In the case where the gate terminal and the source terminal are provided in the same side of the frame region, for example, it is conceivable that the gate terminal and the source terminal are provided only in one of a pair of long sides.

In this case, in order to electrically connect the gate terminal and the gate signal line extending in a row direction (a direction parallel to a long side), a plurality of gate lead-out lines extending in a column direction (a direction parallel to a short side) are separately formed in the pixel region, and the plurality of gate lead-out lines and the plurality of gate signal lines orthogonal to each other are connected to each other through contact holes. In this way, even if the gate terminal and the source terminal are provided in the same long side of the frame region, the gate terminal and the gate signal line can electrically be connected to each other through the gate lead-out line by providing the gate lead-out line intersecting three-dimensionally with the gate signal line. That is, the gate driver and the gate signal line can electrically be connected to each other.

In this case, in the horizontally-long rectangular TFT substrate, because a number of pixels arrayed in the row direction is different from a number of pixels arrayed in the column direction, it is not necessary to form the gate lead-out line extending in the column direction in the whole pixel region, but the gate lead-out line is partially formed in the pixel region. As a result, a difference in density of the wiring pattern of the gate lead-out line is generated in the pixel region.

Conventionally, in the TFT substrate having a structure in which the plurality of gate signal lines and the plurality of gate lead-out lines intersect three-dimensionally with each other, a technique of forming a plurality of dummy gate lead-out lines parallel to gate lead-out line has been proposed in order to prevent a loading effect due to the density difference of the wiring patterns of the gate lead-out lines (see U. S. Patent Application Publication No. 2010/0188378).

However, in the structure disclosed in U. S. Patent Application Publication No. 2010/0188378, a flexibility of layout of various wirings such as the gate lead-out line, the dummy gate lead-out line, and the source signal line in the frame region is lowered because all the dummy gate lead-out lines are connected to the gate terminal while gathered in the frame region in order to apply a predetermined potential to the plurality of dummy gate lead-out lines.

In particular, when the gate terminal and the source terminal are provided in the same side of the frame region, not only the gate lead-out line but also various wirings such as the source signal line are concentrated on one side, and a restriction of the wiring layout becomes large. When the gate driver and the source driver are directly mounted on the frame region by the COG method, not only the flexibility of arrangement layout of the gate driver and the source driver is lowered, but the flexibility of the wiring layout of various wirings such as the gate lead-out line and the source signal line is further lowered.

The present disclosure provides a TFT substrate and a display panel having the high flexibility of the wiring layout although having a structure in which the plurality of gate signal lines intersect with the plurality of gate lead-out lines and the plurality of dummy gate lead-out lines.

A first thin film transistor substrate according to one aspect of the present disclosure includes a pixel region constructed with a plurality of pixels and a frame region surrounding the pixel region. The first thin film transistor substrate includes: a thin film transistor and a pixel electrode provided in each of the plurality of pixels; a plurality of gate signal lines extending in a first direction in the pixel region and supplying a gate signal to the thin film transistor in each of the plurality of pixels; a plurality of gate lead-out lines and a plurality of dummy gate lead-out lines extending in a second direction different from the first direction in the pixel region; a plurality of common lines extending in at least one of the first direction and the second direction in the pixel region, a common potential being applied to the plurality of common lines;

and a common electrode provided opposite to the pixel electrode and electrically connected to the plurality of common lines. The plurality of gate lead-out lines are connected to the gate signal lines at least at one point of a plurality of intersections between the plurality of gate signal lines and the plurality of gate lead-out lines, and the common potential is applied to the plurality of dummy gate lead-out lines.

The first TFT substrate according to one aspect of the present disclosure may further include: a plurality of source signal lines extending in the second direction in the pixel region and supplying a data signal to the thin film transistor in each of the plurality of pixels; a gate terminal including a plurality of gate terminal electrodes connected to the plurality of gate lead-out lines; and a source terminal including a plurality of source terminal electrodes connected to the plurality of source signal lines. The gate terminal and the source terminal may be provided in one long side of a pair of long sides in the frame region of the thin film transistor substrate.

The first TFT substrate according to one aspect of the present disclosure may further include: a shield electrode formed in the frame region, the common potential being applied to shield electrode; and a first connection wiring connecting each of the plurality of dummy gate lead-out lines and the shield electrode through a first contact hole made in the frame region.

In the first TFT substrate according to one aspect of the present disclosure, the first connection wiring may be formed in a layer identical to that of the pixel electrode.

In the first TFT substrate according to one aspect of the present disclosure, the first connection wiring may be formed in a layer identical to that of the common electrode.

In the first TFT substrate according to one aspect of the present disclosure, the shield electrode may be formed in a layer identical to that of a source-drain electrode of the thin film transistor.

In the first TFT substrate according to one aspect of the present disclosure, the shield electrode may be formed in a layer identical to that of the dummy gate lead-out line.

In the first TFT substrate according to one aspect of the present disclosure, the shield electrode may be formed in a mesh shape.

In the first TFT substrate according to one aspect of the present disclosure, for the one first connection wiring, the first contact hole may be made in at least two points of on each of the dummy gate lead-out lines and on the shield electrode.

In the first TFT substrate according to one aspect of the present disclosure, the first contact hole may be made in the other long side of the pair of long sides.

The first TFT substrate according to one aspect of the present disclosure may further include: a common bus wiring formed in the frame region, the common potential being applied to the common bus wiring; and a second connection wiring connecting each of the plurality of dummy gate lead-out lines and the common bus wiring through a second contact hole made in the frame region. The plurality of common wirings are connected to the common bus wiring.

In the first TFT substrate according to one aspect of the present disclosure, the second connection wiring may be formed in a layer identical to that of the pixel electrode.

In the first TFT substrate according to one aspect of the present disclosure, the common bus wiring may include a first electrode formed in a layer identical to that of the common electrode and a second electrode laminated in the first electrode and formed in a layer identical to that of the common line.

In the first TFT substrate according to one aspect of the present disclosure, the second contact hole may be made in the one long side.

In the first TFT substrate according to one aspect of the present disclosure, the second contact hole may be made in the other long side of the pair of long sides.

In the first TFT substrate according to one aspect of the present disclosure, the pixel electrode may be located above the common electrode, the common bus wiring may have an opening, and the second contact hole may be made in the opening.

The first TFT substrate according to one aspect of the present disclosure may further include: a common bus wiring formed in the frame region and connected to the plurality of common lines; and a shield electrode formed in the frame region, the common potential being applied to the shield electrode. The common bus wiring is electrically connected to the shield electrode, and the plurality of dummy gate lead-out lines are also connected to the common bus wiring through a contact hole made in the frame region.

In this case, the contact hole may be made in the one long side.

The contact hole may be made in the other long side of the pair of long sides.

The first TFT substrate according to one aspect of the present disclosure may further include a common connection wiring that connects the common bus wiring and the shield electrode through a contact hole made in the frame region. The common connection wiring may be formed in a layer identical to that of the pixel electrode.

In the first TFT substrate according to one aspect of the present disclosure, the gate terminal or the source terminal may further include a common terminal electrode used to apply the common potential to the common line.

In the first TFT substrate according to one aspect of the present disclosure, the common electrode may be located above the pixel electrode.

A second thin film transistor substrate according to one aspect of the present disclosure includes a pixel region constructed with a plurality of pixels and a frame region surrounding the pixel region. The second thin film transistor substrate includes: a plurality of gate signal lines extending in a first direction in the pixel region; and a plurality of gate lead-out lines and a plurality of dummy gate lead-out lines extending in a second direction different from the first direction in the pixel region. The plurality of gate lead-out lines are connected to the gate signal line at least at one point of a plurality of intersections between the plurality of gate signal lines and the plurality of gate lead-out lines, when the pixel region is divided into at least three of a first region, a second region and a third region along the first direction, (i) the plurality of gate lead-out lines are formed in the second region, and the plurality of dummy gate lead-out lines are formed in each of the first region and the third region, or (ii) the plurality of gate lead-out lines are formed in each of the first region and the third region, and the dummy gate lead-out lines are formed in the second region.

In the second TFT substrate according to one aspect of the present disclosure, the first region may be one end region in the first direction of the pixel region, and the third region may be the other end region in the first direction of the pixel region.

The second TFT substrate according to one aspect of the present disclosure may further include a gate terminal including a plurality of gate terminal electrodes electrically connected to the plurality of gate signal lines. Two gate terminals may be provided in one long side of a pair of long sides in the frame region of the thin film transistor substrate, and the second region may be a region where all the plurality of gate lead-out lines connected to the two gate terminals are formed.

The second TFT substrate according to one aspect of the present disclosure may further include a plurality of source signal lines extending in the second direction in the pixel region and a source terminal including a plurality of source terminal electrodes electrically connected to the plurality of source signal lines. The source terminal may be provided in a long side identical to the long side in which the gate terminal is provided.

The second TFT substrate according to one aspect of the present disclosure may further include a first gate driver and a second gate driver that are disposed with a space in the first direction and supply a gate signal to the plurality of gate signal lines through the plurality of gate lead-out lines. The plurality of gate lead-out lines are constructed with a plurality of first gate lead-out lines connected to the first gate driver and a plurality of second gate lead-out lines connected to the second gate driver, and the plurality of first gate lead-out lines are disposed in the first region, the plurality of second gate lead-out lines are disposed in the third region, and the plurality of dummy gate lead-out lines are disposed in the second region.

The second TFT substrate according to one aspect of the present disclosure may further include: a pixel electrode provided in each of the plurality of pixels; a common electrode provided opposite to the pixel electrode; a shield electrode formed in the frame region, a common potential being applied to the shield electrode; and a first connection wiring connecting each of the plurality of dummy gate lead-out lines and the shield electrode through a first contact hole made in the frame region.

In the second TFT substrate according to one aspect of the present disclosure, the first connection wiring may be formed in a layer identical to that of the pixel electrode.

In the second TFT substrate according to one aspect of the present disclosure, the first connection wiring may be formed in a layer identical to that of the common electrode.

The second TFT substrate according to one aspect of the present disclosure may include a thin film transistor provided in each of the plurality of pixels. The shield electrode is formed in a layer identical to that of a source-drain electrode of the thin film transistor.

In the second TFT substrate according to one aspect of the present disclosure, the shield electrode may be formed in a layer identical to that of the dummy gate lead-out line.

In the second TFT substrate according to one aspect of the present disclosure, the shield electrode may be formed in a mesh shape.

In the second TFT substrate according to one aspect of the present disclosure, for the one first connection wiring, the first contact hole may be made in at least two points of on each of the dummy gate lead-out lines and on the shield electrode.

In the second TFT substrate according to one aspect of the present disclosure, the first contact hole may be made in the other long side of the pair of long sides.

The second TFT substrate according to one aspect of the present disclosure may further include: a common bus wiring formed in the frame region, the common potential being applied to the common bus wiring; and a second connection wiring connecting each of the plurality of dummy gate lead-out lines and the common bus wiring through a second contact hole made in the frame region. The plurality of common wirings are connected to the common bus wiring.

In the second TFT substrate according to one aspect of the present disclosure, the second connection wiring may be formed in a layer identical to that of the pixel electrode.

In the second TFT substrate according to one aspect of the present disclosure, the common bus wiring may include a first electrode formed in a layer identical to that of the common electrode and a second electrode laminated in the first electrode and formed in a layer identical to that of the common line.

In the second TFT substrate according to one aspect of the present disclosure, the second contact hole may be made in the one long side.

The second TFT substrate according to one aspect of the present disclosure may include a common bus wiring formed in the frame region and connected to the plurality of common lines. The common bus wiring may electrically be connected to the shield electrode, and the plurality of dummy gate lead-out lines may be connected to the common bus wiring through a contact hole made in the frame region.

In the second TFT substrate according to one aspect of the present disclosure, the contact hole may be made in the one long side.

In the second TFT substrate according to one aspect of the present disclosure, the contact hole may be made on the other long side of the pair of long sides.

The second TFT substrate according to one aspect of the present disclosure may further include a dummy gate terminal electrode used to apply a predetermined potential to the dummy gate lead-out line. A dummy gate relay wiring is provided in a route between each of the dummy gate lead-out lines and the dummy gate terminal electrode in the frame region, the plurality of gate lead-out lines and the plurality of dummy gate lead-out lines are formed in a layer identical to that of the plurality of source signal lines, the dummy gate relay wiring is formed in a layer identical to that of the plurality of gate signal lines, and formed in a layer different from that of the plurality of source signal lines, and the dummy gate relay wiring is connected to each of the dummy gate lead-out lines through a contact hole, and connected to the dummy gate terminal electrode through a contact hole.

In the second TFT substrate according to one aspect of the present disclosure, the dummy gate relay wiring and the plurality of gate signal lines may be formed in a layer identical to that of a gate electrode of a thin film transistor provided in each of the plurality of pixels.

A display panel according to one aspect of the present disclosure further includes: the first or second thin film transistor substrate; and a counter substrate opposed to the thin film transistor substrate.

A third thin film transistor substrate according to one aspect of the present disclosure includes a pixel region constructed with a plurality of pixels and a frame region surrounding the pixel region. The third thin film transistor includes: a plurality of gate signal lines extending in a first direction in the pixel region; a plurality of source lines extending in a second direction different from the first direction in the pixel region; a plurality of gate lead-out lines and a plurality of dummy gate lead-out lines extending in the second direction in the pixel region; a gate terminal including a plurality of gate terminal electrodes connected to the plurality of gate lead-out lines respectively; and a source terminal including a plurality of source terminal electrodes connected to the plurality of source signal lines respectively. The plurality of gate lead-out lines are respectively connected to the plurality of gate signal lines at least at one point of a plurality of intersections between the plurality of gate signal lines and the plurality of gate lead-out lines, a dummy gate terminal electrode used to apply a predetermined potential to the plurality of dummy gate lead-out lines is provided, a dummy gate relay wiring is provided in a route between each of the dummy gate lead-out lines and the dummy gate terminal electrode in the frame region, the plurality of gate lead-out lines and the plurality of dummy gate lead-out lines are formed in a layer identical to that of the plurality of source signal lines, and the dummy gate relay wiring is connected to the dummy gate lead-out lines through respective contact holes, and connected to the dummy gate terminal electrode through respective contact holes.

BRIEF DESCRIPTION OF THE DRAWINGS

FIG. 4 is a partial sectional view of the display panel taken along line IV-IV in

FIG. 2;

FIG. 5 is a partial sectional view of the display panel taken along line V-V in

FIG. 1;

FIG. 6 is a partial sectional view of the display panel taken along line VI-VI in

FIG. 1;

DETAILED DESCRIPTION

The following describes an exemplary embodiment of the present disclosure. The embodiment described below is merely one specific example of the present disclosure. The numerical values, shapes, materials, elements, and arrangement and connection of the elements, etc. indicated in the following embodiment are given merely by way of illustration and are not intended to limit the present disclosure. Therefore, among elements in the following embodiment, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

(Exemplary Embodiment)

Figure 1:
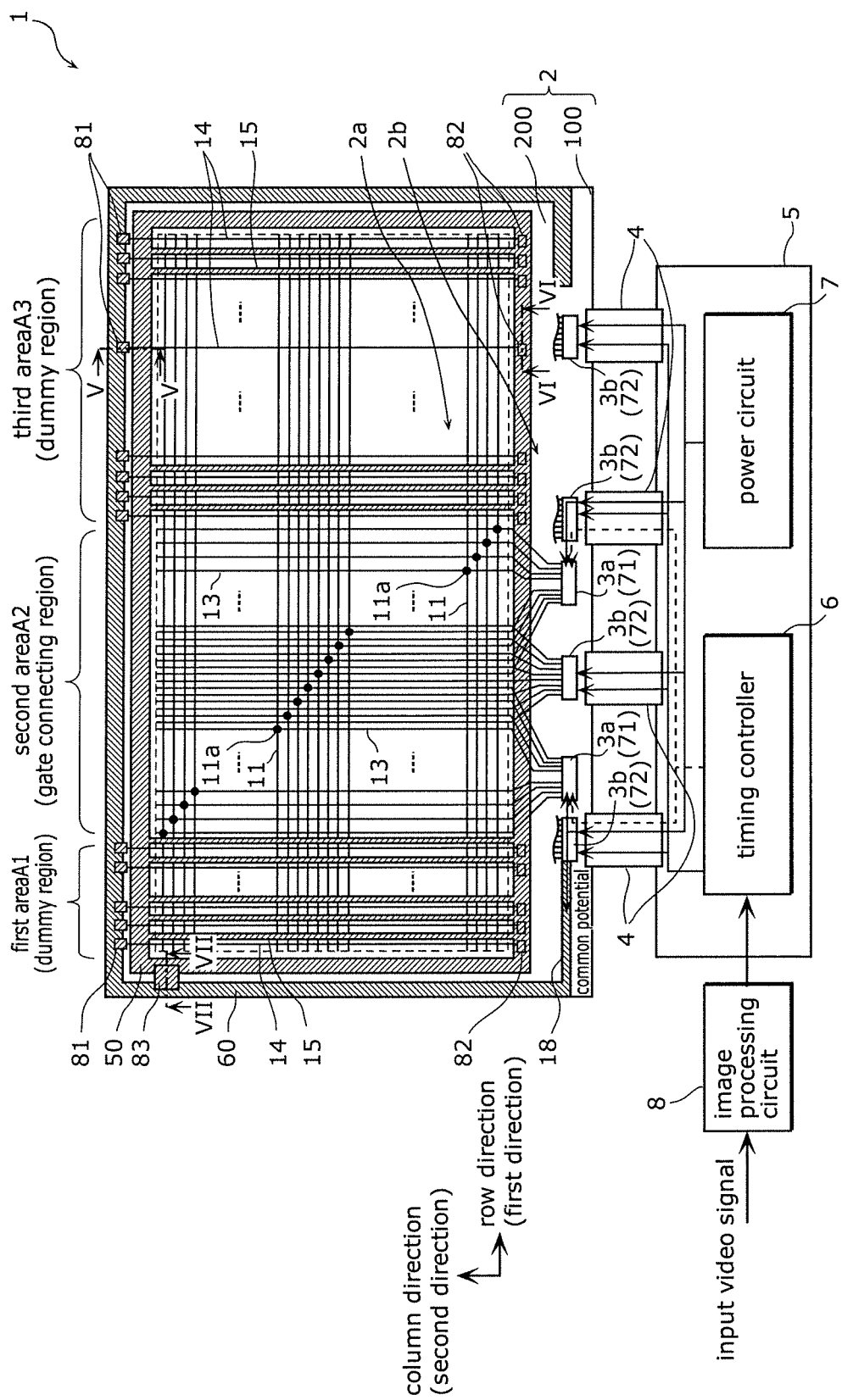
FIG. 1 is a schematic view illustrating an image display device according to an exemplary embodiment.
Figure 2:
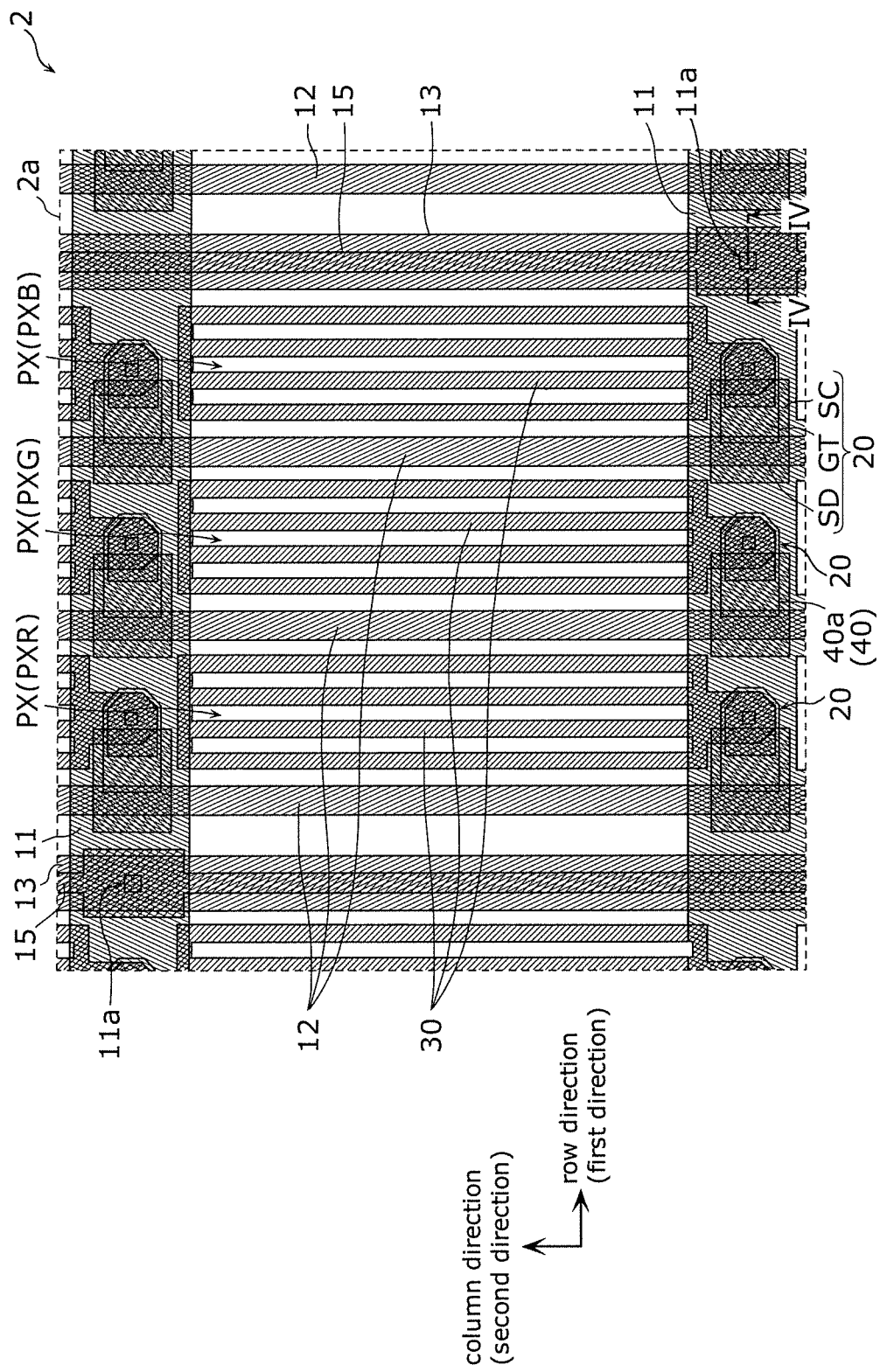
FIG. 2 is a plan view illustrating a configuration of pixels of a display panel of the exemplary embodiment.
Figure 3:
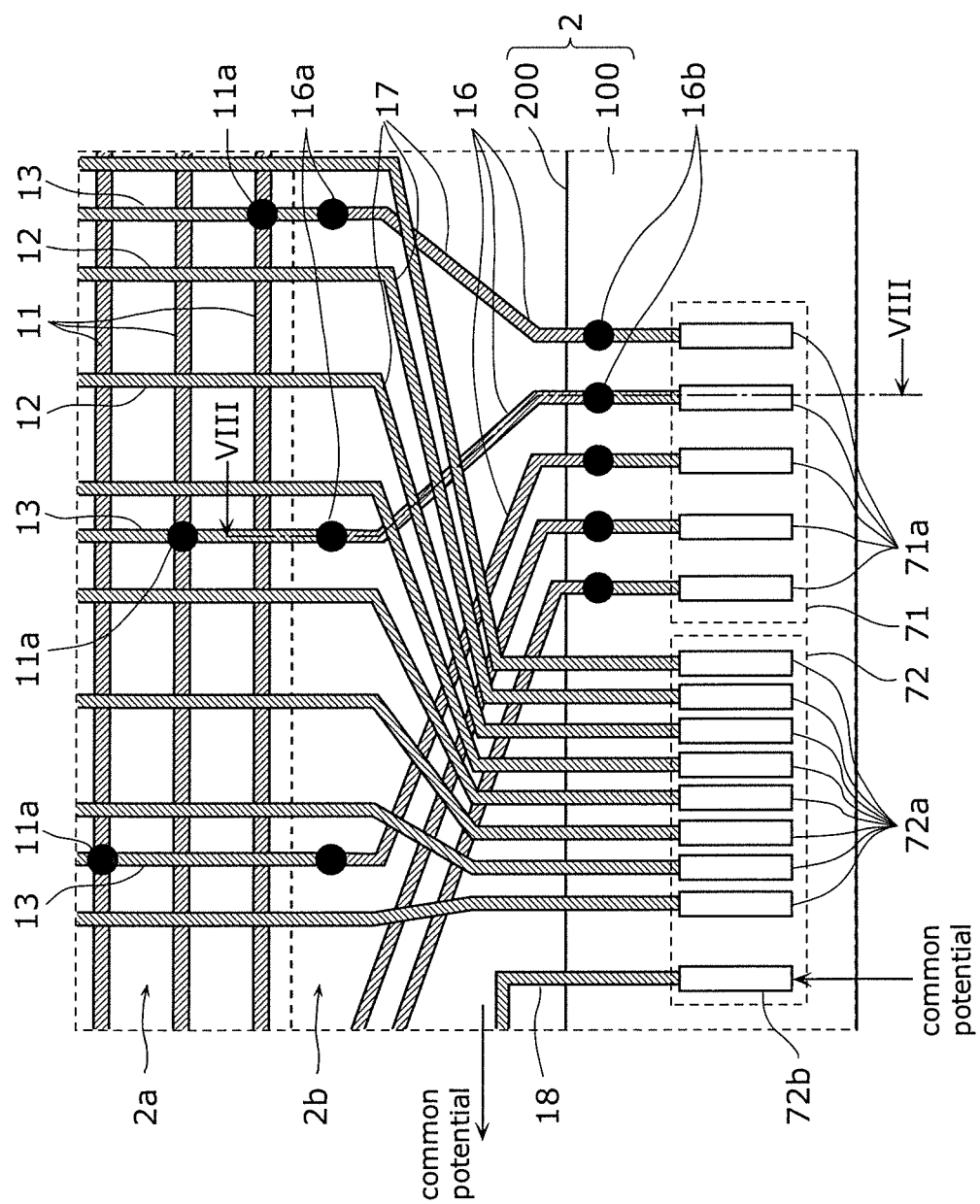
FIG. 3 is a plan view illustrating a configuration around a gate terminal and a source terminal in the display panel of the exemplary embodiment.

Image display device 1 according to an exemplary embodiment will be described below with reference to FIGS. 1 to 3. FIG. 1 is a view illustrating a schematic configuration of image display device 1 of the exemplary embodiment. FIG. 2 is a plan view illustrating a configuration of pixel PX in display panel 2 of the exemplary embodiment. FIG. 2 illustrates the configuration of pixel PX in second region A2 where gate lead-out line 13 is led out in pixel region 2a. FIG. 3 is a plan view illustrating a configuration around gate terminal 71 and source terminal 72 in display panel 2 of the exemplary embodiment. FIG. 3 illustrates a state in which gate driver 3a, source driver 3b, and flexible wiring board 4 are not mounted on gate terminal 71 and source terminal 72.

Image display device 1 displays an image (video) in a pixel region constructed with a plurality of pixels. The image displayed on image display device 1 may be either a still image or a moving image.

As illustrated in FIG. 1, image display device 1 includes display panel 2, gate driver 3a and source driver 3b provided as drivers that drive display panel 2, and flexible wiring board 4 connected to display panel 2, and circuit board 5 connected to flexible wiring board 4.

Image display device 1 further includes timing controller 6 that outputs a control signal to gate driver 3a and source driver 3b, a power supply circuit 7 that generates various control voltages supplied to gate driver 3a, source driver 3b, and display panel 2, and image processing circuit 8 that outputs image data to timing controller 6 based on an input video signal.

In the exemplary embodiment, timing controller 6 and power supply circuit 7 are mounted on the circuit board 5. Circuit board 5 is a printed circuit board (PCB) having a substantially rectangular plate shape, and a plurality of electronic components constituting timing controller 6 and power supply circuit 7 are mounted on circuit board 5. Circuit board 5 has a function of transmitting various signals output from timing controller 6 and various control voltages output from power supply circuit 7 to gate driver 3a, source driver 3b, and display panel 2.

In the exemplary embodiment, because image display device 1 is a liquid crystal display device, display panel 2 is a liquid crystal display panel. Although not illustrated, image display device 1 includes a backlight disposed on a back surface side of display panel 2.

Display panel 2 is a liquid crystal display panel that displays a color image, and includes a liquid crystal cell in which a liquid crystal layer is provided between a pair of substrates and a pair of polarizing plates sandwiching the liquid crystal cell.

One of the pair of substrates sandwiching the liquid crystal layer is TFT substrate 100 (first substrate) on which a TFT, a wiring, and the like are formed, and the other of the pair of substrates is CF substrate 200 (second substrate) on which R (red), G (green), and B (blue) color filters (CO are formed.

In the exemplary embodiment, because display panel 2 is an active matrix driving system display panel, TFT substrate 100 is an active matrix substrate (TFT array substrate) in which a plurality of TFTs are provided into a matrix form. For example, a liquid crystal driving system of display panel 2 is a lateral electric field system such as an in-plane switching (IPS) system or a fringe field switching (FFS) system. Alternatively, the liquid crystal driving system may be a vertical alignment (VA) system or a twisted nematic (TN) system.

As illustrated in FIG. 1, display panel 2 includes pixel region 2a constructed with a plurality of pixels and frame region 2b surrounding pixel region 2a. That is, TFT substrate 100 and CF substrate 200 include pixel region 2a and frame region 2b. Pixel region 2a is a display region (effective region) where an image is displayed. For example, pixel region 2a is constructed with a plurality of pixels arranged into a matrix form. Frame region 2b is a peripheral region of display panel 2, and is located outside pixel region 2a. Frame region 2b is a non-display region (invalid region) where the image is not displayed. In the exemplary embodiment, display panel 2 has a rectangular shape in planar view. Specifically, TFT substrate 100 and CF substrate 200 has the rectangular shape in planar view. Thus, pixel region 2a has the rectangular shape, and frame region 2b has a rectangular frame shape.

TFT substrate 100 includes a plurality of gate signal lines 11 (scanning signal lines), a plurality of source signal lines 12 (data lines), a plurality of gate lead-out lines 13, a plurality of dummy gate lead-out lines 14, and a plurality of common lines 15 as wirings. The plurality of gate signal lines 11, the plurality of source signal lines 12, the plurality of gate lead-out lines 13, the plurality of dummy gate lead-out lines 14, and the plurality of common lines 15 are formed at least in pixel region 2a.

The plurality of gate signal lines 11 extend in a first direction in pixel region 2a. In the exemplary embodiment, because the first direction is a row direction (a direction parallel to a long side of rectangular TFT substrate 100) that is a horizontal direction, the plurality of gate signal lines 11 extend in the row direction. The plurality of gate signal lines 11 are formed in parallel to each other in pixel region 2a.

The plurality of source signal lines 12 extend in a second direction different from the first direction in pixel region 2a. In the exemplary embodiment, because the second direction is a direction orthogonal to the first direction and is a column direction (a direction parallel to the short side of the rectangular TFT substrate 100) that is a vertical direction, the plurality of source signal lines 12 extend in the column direction. Thus, the plurality of source signal lines 12 and the plurality of gate signal lines 11 intersect three-dimensionally with each other. The plurality of source signal lines 12 are formed in parallel to each other in pixel region 2a.

Each of the plurality of pixels constituting pixel region 2a is a region surrounded by gate signal line 11 extending in the row direction and source signal line 12 extending in the column direction.

As illustrated in FIG. 2, one gate signal line 11 is provided for each boundary between two pixels PX (subpixels) adjacent to each other in the column direction. One gate signal line 11 is connected to TFT 20 of each of the plurality of pixels PX arrayed in the row direction, and supplies a gate signal to each TFT. Specifically, each gate signal line 11 is connected to gate electrode GT of TFT 20 of each pixel PX.

One source signal line 12 is provided at each boundary between two pixels PX adjacent to each other in the row direction. One source signal line 12 is connected to the plurality of TFTs 20 in each of the plurality of pixels PX arrayed in the column direction, and supplies a data signal to each TFT. Specifically, each source signal line 12 is connected to one of the pair of source-drain electrodes SD of each TFT 20. In each pixel PX, the other of source-drain electrode SD of TFT 20 is connected to pixel electrode 30.

As illustrated in FIG. 2, TFT 20, pixel electrode 30, and common electrode 40 are provided in each of the plurality of pixels PX constituting pixel region 2a. TFT 20 includes gate electrode GT and a pair of source-drain electrodes SD. One of the pair of source-drain electrodes SD is a source electrode, and the other is a drain electrode.

One TFT 20 and one pixel electrode 30 are provided in each pixel PX. Specifically, one TFT 20 and one pixel electrode 30 are provided in each of red pixel PXR, green pixel PXG, and blue pixel PXB. A plurality of TFTs 20 and a plurality of pixel electrodes 30 may be provided in each pixel PX.

Common electrode 40 is provided opposite to pixel electrode 30. Common electrode 40 and pixel electrode 30 may be opposed to each other in a laminating direction, or may be opposed to each other in a direction crossing the laminating direction.

Common electrode 40 is provided over the plurality of pixels PX. In the exemplary embodiment, common electrode 40 is provided over all pixels PX in pixel region 2a. That is, common electrode 40 is one planar electrode common to all pixels PX, and is formed over whole pixel region 2a. Common electrode 40 may be provided for each pixel PX.

As illustrated in FIG. 1, a plurality of gate lead-out lines 13 are formed on TFT substrate 100. The plurality of gate lead-out lines 13 extend in the second direction in pixel region 2a. Specifically, the plurality of gate lead-out lines 13 extend in the column direction (vertical direction). The plurality of gate lead-out lines 13 are formed in parallel to each other in pixel region 2a. That is, the plurality of gate lead-out lines 13 are formed in parallel to the plurality of source signal lines 12, and are orthogonal to the plurality of gate signal lines 11. Thus, the plurality of gate lead-out lines 13 and the plurality of gate signal lines 11 intersect three-dimensionally with each other.

Each gate lead-out line 13 supplies the gate signal output from gate driver 3a to gate signal line 11 corresponding to gate lead-out line 13. Thus, the plurality of gate lead-out lines 13 are connected to gate signal line 11 at least at one point of a plurality of intersections between the plurality of gate signal lines 11 and the plurality of gate lead-out lines 13. That is, each of the plurality of gate signal lines 11 is electrically connected to at least one gate lead-out line 13. Specifically, the plurality of gate signal lines 11 and the plurality of gate lead-out lines 13 are connected to each other through gate contact hole 11a at least at one point of the plurality of three-dimensional intersections of the plurality of gate signal lines 11 and the plurality of gate lead-out lines 13 in pixel region 2a.

For example, one gate signal line 11 and one gate lead-out line 13 are connected to each other at one point. Thus, one gate signal line 11 is connected to one gate lead-out line 13 at one gate contact hole 11a.

One gate signal line 11 may be connected to two gate lead-out lines 13. That is, one gate signal line 11 is connected to two gate lead-out lines 13 at two gate contact holes 11a. A number of gate contact holes 11a in one gate signal line 11 is not limited to one or two, but may be at least three. The number of gate contact holes 11a only needs to be at least one. That is, one gate signal line 11 only needs to be connected to at least one gate lead-out line 13.

As illustrated in FIG. 2, gate lead-out line 13 is provided between two pixels PX adjacent to each other in the row direction. For example, gate lead-out line 13 is provided for every three pixels PX adjacent to one another in the row direction. As an example, one gate lead-out line 13 is provided for every three subpixels in units of three subpixels of red pixel PXR, green pixel PXG, and blue pixel PXB. Gate lead-out line 13 may be formed between any pixels in pixel region 2a according to the number of the plurality of gate signal lines 11 extending in the row direction.

As described above, in display panel 2, gate signal line 11 that is a horizontal gate line extending in the row direction and gate lead-out line 13 that is a vertical gate line extending in the column direction are provided as a wiring (gate line) for the gate signal output from gate driver 3a.

As illustrated in FIG. 1, the plurality of dummy gate lead-out lines 14 are formed on TFT substrate 100. The plurality of dummy gate lead-out lines 14 extend in the first direction in pixel region 2a. Specifically, the plurality of dummy gate lead-out lines 14 extend in the column direction (vertical direction) similarly to the plurality of source signal lines 12 and the plurality of gate lead-out lines 13. The plurality of dummy gate lead-out lines 14 are formed in parallel to each other in pixel region 2a. That is, the plurality of dummy gate lead-out lines 14 are formed in parallel to the plurality of source signal lines 12 and the plurality of gate lead-out lines 13, and are orthogonal to the plurality of gate signal lines 11. Thus, the plurality of dummy gate lead-out lines 14 and the plurality of gate signal lines 11 intersect three-dimensionally with each other.

Unlike gate lead-out line 13, the plurality of dummy gate lead-out lines 14 are not connected to gate signal line 11. The plurality of dummy gate lead-out lines 14 are not connected to gate lead-out line 13. That is, the gate signal is not supplied to each of the plurality of dummy gate lead-out lines 14. Although details will be described later, a common potential applied to common line 15 is applied to the plurality of dummy gate lead-out lines 14.

Dummy gate lead-out line 14 is formed for the purpose of preventing degradation of display quality caused by a density difference of a wiring pattern of gate lead-out line 13. For this reason, dummy gate lead-out line 14 is preferably formed in the same layout as gate lead-out line 13 in the region where gate lead-out line 13 is not formed in pixel region 2a.

For example, similarly to gate lead-out line 13, one dummy gate lead-out line 14 may be provided for every three pixels PX adjacent to one another in the row direction. As an example, dummy gate lead-out line 14 is provided in each unit of three subpixels with the three subpixels of red pixel PXR, green pixel PXG, and blue pixel PXB.

In the exemplary embodiment, the plurality of gate lead-out lines 13 are gathered. The plurality of dummy gate lead-out lines 14 are also gathered. That is, the region where only the plurality of gate lead-out lines 13 among gate lead-out lines 13 and dummy gate lead-out lines 14 are formed and the region where only the plurality of dummy gate lead-out lines 14 among gate lead-out lines 13 and dummy gate lead-out lines 14 are formed exist in pixel region 2a.

Specifically, as illustrated in FIG. 1, when pixel region 2a is divided into three regions of first region A1, second region A2, and third region A3 along the first direction (in the exemplary embodiment, the row direction), the plurality of gate lead-out lines 13 are collectively formed in second region A2, and the plurality of dummy gate lead-out lines 14 are collectively formed in each of first region A1 and third region A3.

That is, in second region A2, only the gate lead-out line 13 among gate lead-out line 13 and dummy gate lead-out line 14 is formed, and dummy gate lead-out line 14 is not formed. Second region A2 is a gate connection region where gate contact hole 11a at which gate lead-out line 13 and gate signal line 11 are connected to each other is made.

On the other hand, first region A1 and third region A3 are a dummy region where only dummy gate lead-out line 14 among gate lead-out line 13 and dummy gate lead-out line 14 is formed, and gate lead-out line 13 is not formed in first region A1 and third region A3.

In the exemplary embodiment, first region A1 is one end region in the row direction of pixel region 2a, and third region A3 is the other end region in the row direction of pixel region 2a. Second region A2 is a region between first region A1 and third region A3. Specifically, second region A2 is a central region including a center of TFT substrate 100, and is a region where all the plurality of gate lead-out lines 13 connected to gate terminals 71 are formed. Widths of first region A1, second region A2, and third region A3 may be identical to or different from one another.

Common line 15 extends in at least one of the first direction and the second direction in pixel region 2a. As illustrated in FIG. 1, in the exemplary embodiment, the plurality of common lines 15 extend only in the column direction (vertical direction) similarly to the plurality of source signal lines 12, the plurality of gate lead-out lines 13, and the plurality of dummy gate lead-out lines 14, and are formed in parallel to each other in pixel region 2a. That is, the plurality of common lines 15 are formed in parallel to the plurality of source signal lines 12, the plurality of gate lead-out lines 13, and the plurality of dummy gate lead-out lines 14, and are orthogonal to the plurality of gate signal lines 11. Thus, the plurality of common lines 15 and the plurality of gate signal lines 11 intersect three-dimensionally with each other.

As illustrated in FIG. 2, in the exemplary embodiment, common line 15 is provided between two pixels PX adjacent to each other in the row direction. Specifically, common line 15 is provided for every three pixels PX adjacent to each other in the row direction. For example, similarly to gate lead-out line 13, one common line 15 is provided for every three subpixels in units of three subpixels of red pixel PXR, green pixel PXG, and blue pixel PXB. Common line 15 is formed over the whole pixel region 2a. That is, common line 15 is formed in each of first region A1, second region A2, and third region A3.

Common line 15 may be provided between all the pixels. The common line 15 is not limited to extending only in the column direction, but may extend only in the row direction, or may extend in both the row direction and the column direction.

As illustrated in FIG. 2, in second region A2, common line 15 extends in the column direction so as to overlap gate lead-out line 13 in planar view. Although not illustrated, common line 15 extends in the column direction so as to overlap dummy gate lead-out line 14 in planar view in first region A1 and third region A3. Common line 15 may be formed so as not to overlap gate lead-out line 13 and dummy gate lead-out line 14 in planar view.

The common potential is applied to the plurality of common lines 15. In the exemplary embodiment, the plurality of common lines 15 are connected to common bus wiring 50 to which the common potential is applied. That is, the common potential is applied from common bus wiring 50 to the plurality of common lines 15. Common line 15 and common electrode 40 are in contact with each other, and the common potential is applied to common electrode 40. That is, common line 15 and common electrode 40 are set to the same potential. Common line 15 and dummy gate lead-out line 14 have the same potential.

Common bus wiring 50 is formed in frame region 2b of TFT substrate 100. In the exemplary embodiment, common bus wiring 50 is formed so as to surround pixel region 2a. Specifically, common bus wiring 50 is formed in a rectangular frame shape. As long as common bus wiring 50 is connected to all common lines 15, the shape of common bus wiring 50 is not limited to the frame shape.

Shield electrode 60 is also formed in frame region 2b of TFT substrate 100. Shield electrode 60 is also formed so as to surround pixel region 2a. In the exemplary embodiment, shield electrode 60 is formed so as to surround common bus wiring 50. Specifically, shield electrode 60 is formed in an outermost periphery of frame region 2b of rectangular TFT substrate 100, and formed over the long side and the short side of frame region 2b. As an example, shield electrode 60 is formed over at least three sides except for the side in which gate terminal 71 and source terminal 72 are provided.

Thus, a signal noise can be prevented by providing shield electrode 60. Thus, a constant potential is preferably applied to shield electrode 60. In the exemplary embodiment, the common potential is applied to shield electrode 60. That is, shield electrode 60, common bus wiring 50, and common line 15 are set to have the same potential. Shield electrode 60 and dummy gate lead-out line 14 also have the same potential.

A plurality of slit-shaped or circular openings are preferably formed in shield electrode 60. As an example, shield electrode 60 is formed in a mesh shape so as to have innumerable openings. Thus, even if the sealing member that seals the liquid crystal layer between TFT substrate 100 and CF substrate 200 is laminated on shield electrode 60, the sealing member can be easily cured by forming the plurality of openings in shield electrode 60. For example, when the material for the sealing member is an ultraviolet curable resin, the sealing member can be cured by irradiating the sealing member applied onto shield electrode 60 through the opening of shield electrode 60 with an ultraviolet ray.

As described above, the plurality of gate signal lines 11, the plurality of source signal lines 12, the plurality of gate lead-out lines 13, the plurality of dummy gate lead-out lines 14, and common line 15 are provided as wirings on TFT substrate 100.

Because source signal line 12, gate lead-out line 13, dummy gate lead-out line 14, and common line 15 are orthogonal to gate signal line 11, source signal line 12, gate lead-out line 13, dummy gate lead-out line 14, and common line 15 and gate signal lines 11 are formed in different metal layers (wiring layers). Source signal line 12, gate lead-out line 13, and dummy gate lead-out line 14 are formed in the same metal layer.

In the exemplary embodiment, a first metal layer in which gate signal line 11 is formed is located below a second metal layer in which source signal line 12, gate lead-out line 13, and dummy gate lead-out line 14 are formed. Specifically, gate signal line 11 is covered with the gate insulator, and source signal line 12, gate lead-out line 13, and dummy gate lead-out line 14 are disposed on the gate insulator. Specifically, the gate insulator is formed as an interlayer insulating film between the first metal layer in which gate signal line 11 is formed and the second metal layer in which source signal line 12, gate lead-out line 13, and dummy gate lead-out line 14 are formed. Common line 15 is located in an upper layer of the second metal layer in which source signal line 12, gate lead-out line 13, and dummy gate lead-out line 14 are formed.

The gate signal generated by gate driver 3a is supplied to gate signal line 11 through gate lead-out line 13. The data signal generated by source driver 3b is supplied to source signal line 12.

As illustrated in FIG. 1, gate driver 3a and source driver 3b are mounted on TFT substrate 100 by a COG method. Specifically, gate driver 3a is mounted on gate terminal 71 provided in frame region 2b of TFT substrate 100. Source driver 3b is mounted on source terminal 72 provided in frame region 2b of TFT substrate 100.

In the exemplary embodiment, gate terminal 71 and source terminal 72 are mounted on one of a pair of sides in frame region 2b of TFT substrate 100. That is, gate terminal 71 and source terminal 72 are provided on the same side of frame region 2b.

Specifically, gate terminal 71 and source terminal 72 are provided in only one (the long side on the lower side in FIG. 1) of a pair of long sides of the four sides of frame region 2b in rectangular TFT substrate 100. Thus, gate driver 3a and source driver 3b are also mounted on only one of the pair of long sides of frame region 2b in TFT substrate 100. That is, gate driver 3a and source driver 3b are mounted on the same long side.

As an example, two gate terminals 71 are provided in one long side of the pair of long sides in frame region 2b. Therefore, two gate drivers 3a are provided in one long side of the pair of long sides in frame region 2b. One of two gate drivers 3a is a first gate driver, and the other of two gate drivers 3a is a second gate driver. The first gate driver and the second gate driver are disposed with a space in the row direction (first direction), and supply the gate signal to the plurality of gate signal lines 11 through the plurality of gate lead-out lines 13.

Four source terminals 72 are provided in the same long side as the long side in which gate terminal 71 is provided. Thus, four source drivers 3b are mounted in the same long side as the long side on which gate driver 3a is mounted. Four source drivers 3b are arranged at intervals in the row direction (first direction).

Each gate terminal 71 is provided between two source terminals 72 adjacent to each other. That is, each gate driver 3a is mounted between two source drivers 3b adjacent to each other.

As illustrated in FIG. 3, gate terminal 71 includes a plurality of gate terminal electrodes 71a electrically connected to the plurality of gate signal lines 11, respectively. Specifically, each gate signal line 11 is electrically connected to a corresponding one of the plurality of gate terminal electrodes 71a through gate lead-out line 13 corresponding to the corresponding one of the plurality of gate terminal electrodes 71a. The plurality of gate terminal electrodes 71a are electrically connected to the plurality of gate signal lines 11 on a one-to-one basis.

Source terminal 72 includes a plurality of source terminal electrodes 72a electrically connected to the plurality of source signal lines 12, respectively. Specifically, the plurality of source terminal electrodes 72a are electrically connected to the plurality of source signal lines 12 on a one-to-one basis.

Gate driver 3a mounted on gate terminal 71 is electrically connected to gate signal line 11. In the exemplary embodiment, gate driver 3a is electrically connected to gate signal line 11 through gate lead-out line 13. Specifically, gate driver 3a is electrically connected to gate signal line 11 and gate lead-out line 13 by gate relay wiring 16 provided in frame region 2b of TFT substrate 100.

Gate relay wiring 16 connects gate lead-out line 13 and gate terminal electrode 71a of gate terminal 71. Gate relay wiring 16 is formed in a metal layer different from the metal layer of gate lead-out line 13, and connected to gate lead-out line 13 through contact hole 16a. Gate relay wiring 16 is connected to gate terminal electrode 71a through contact hole 16b. In the exemplary embodiment, gate relay wiring 16 is formed in the same layer as that of gate signal line 11. Thus, contact holes 16a and 16b are made in the gate insulator between the first metal layer in which gate relay wiring 16 and gate signal line 11 are formed and the second metal layer in which source signal line 12 and gate lead-out line 13 are formed.

The gate driver 3a supplies a voltage corresponding to the timing signal supplied from the timing controller 6 to each gate signal line 11 in pixel region 2a as a gate signal. Specifically, when the timing signal generated by timing controller 6 is supplied to gate driver 3a through flexible wiring board 4 and source terminal 72, gate driver 3a generates on-voltage $V_{ON}$ (gate-on voltage) turning on the TFT of the pixel in which the data signal is written and off-voltage $V_{OFF}$ turning off the TFT as the gate signal according to the timing signal. The gate signal generated by gate driver 3a is supplied to gate signal line 11 through gate relay wiring 16 and gate lead-out line 13. For example, gate driver 3a is a gate driver IC constructed with an IC chip.

Source driver 3b mounted on source terminal 72 is electrically connected to source signal line 12. In the exemplary embodiment, source driver 3b is electrically connected to source signal line 12 by source relay wiring 17 provided in frame region 2b of TFT substrate 100.

Source relay wiring 17 connects source signal line 12 and source terminal electrode 72a of source terminal 72. Source relay wiring 17 is formed in the same metal layer as that of source signal line 12, and formed in the layer different from that of gate relay wiring 16. Consequently, source relay wiring 17 and gate relay wiring 16 can intersect three-dimensionally with each other in frame region 2b. Because source relay wiring 17 and source signal line 12 are formed in the same metal layer, source relay wiring 17 and source signal line 12 are continuously formed with no use of the contact hole.

Source driver 3b supplies voltage corresponding to the video signal representing a gradation value of each pixel supplied from timing controller 6 to each source signal line 12 in pixel region 2a as the data signal. Specifically, when the video signal generated by timing controller 6 is supplied to source driver 3b, source driver 3b generates the data signal supplied to each of the TFTs connected to gate signal line 11 selected by gate driver 3a based on the voltage corresponding to the video signal. The data signal generated by source driver 3b is supplied to each source signal line 12 in pixel region 2a. Consequently, the data signal is written in the pixel corresponding to the selected gate line. For example, source driver 3b is a source driver IC constructed with an IC chip.

Flexible wiring board 4 is a wiring cable in which a plurality of pattern wirings are formed on a flexible board such as FFC (Flexible Flat Cable) and FPC (Flexible Printed Cable). In the exemplary embodiment, gate driver 3a and source driver 3b are not mounted on flexible wiring board 4.

One end of flexible wiring board 4 is connected to frame region 2b of TFT substrate 100 by, for example, ACF (Anisotropic Conductive Film) pressure-bonding. The other end of flexible wiring board 4 is connected to circuit board 5 by ACF pressure-bonding. Consequently, gate terminal 71 and source terminal 72 provided in frame region 2b of TFT substrate 100 are electrically connected to timing controller 6 and power supply circuit 7 of circuit board 5 through flexible wiring board 4.

In the exemplary embodiment, flexible wiring board 4 is connected only to source terminal 72 in gate terminal 71 and source terminal 72. Thus, various control signals and various control voltages supplied from circuit board 5 are input only to source terminal 72 through flexible wiring board 4. For this reason, various control signals and various control voltages supplied from circuit board 5 to gate terminal 71 are input to gate terminal 71 through source terminal 72. In this case, in addition to source terminal electrode 72a to which the video signal from timing controller 6 is input, source terminal 72 includes a gate relay terminal electrode to which the timing signal supplied from timing controller 6 to gate driver 3a through gate terminal 71 is input and pluralities of control signal terminal electrodes and control voltage terminal electrodes to which the control signal and the control voltage supplied from power supply circuit 7 to gate driver 3a and source driver 3b are input.

In the exemplary embodiment, source terminal 72 further includes common terminal electrode 72b used to apply the common potential to common line 15. Common terminal electrode 72b is electrically connected to power supply circuit 7 of circuit board 5 through flexible wiring board 4. Common voltage $V_{COM}$ is input from power supply circuit 7 to common terminal electrode 72b. Common voltage $V_{COM}$ supplied to common terminal electrode 72b is supplied to shield electrode 60 through common relay wiring 18 formed in frame region 2b. Common relay wiring 18 connects common terminal electrode 72b and shield electrode 60.

Consequently, the common potential (common voltage $V_{COM}$) is applied to shield electrode 60 through common relay wiring 18. Because shield electrode 60 and common bus wiring 50 are connected to each other, the common potential is also applied to common bus wiring 50 when applied to shield electrode 60. Thus, the common potential is applied to the plurality of common lines 15 connected to common bus wiring 50. Common voltage $V_{COM}$ is a constant voltage, and ranges from 1 V to 7 V as an example. However, common voltage $V_{COM}$ is not limited thereto.

Timing controller 6 reads correction data stored in a memory, performs various pieces of image signal processing such as color adjustment on the image data from image processing circuit 8 based on the correction data, and generates the video signal indicating the gradation value of each pixel and the timing signal as a control signal supplied to TFT substrate 100. The timing signal generated by timing controller 6 is supplied to gate driver 3a through flexible wiring board 4 and gate terminal 71. The video signal generated by timing controller 6 is supplied to source driver 3b through flexible wiring board 4 and source terminal 72. Timing controller 6 is constructed with an arithmetic processing circuit such as a CPU. As an example, timing controller 6 is constructed with an IC chip.

Power supply circuit 7 generates various control voltages. Specifically, power supply circuit 7 generates a power supply voltage (drive voltage) and a ground voltage as control voltages controlling gate driver 3a and source driver 3b, and generates various voltages such as a common voltage $V_{COM}$. Control voltages (such as the power supply voltage, the ground voltage, and the common voltage) generated by power supply circuit 7 are supplied to gate driver 3a, source driver 3b, and TFT substrate 100 through flexible wiring board 4. The common voltage generated by power supply circuit 7 is supplied to common bus wiring 50 and shield electrode 60 through flexible wiring board 4.

Image processing circuit 8 receives an input video signal transmitted from an external system (not illustrated), performs image processing, and outputs the image data to timing controller 6. Image processing circuit 8 is not mounted on circuit board 5, but may be mounted on circuit board 5. As an example, timing controller 6 is constructed with an IC chip.

Figure 4:
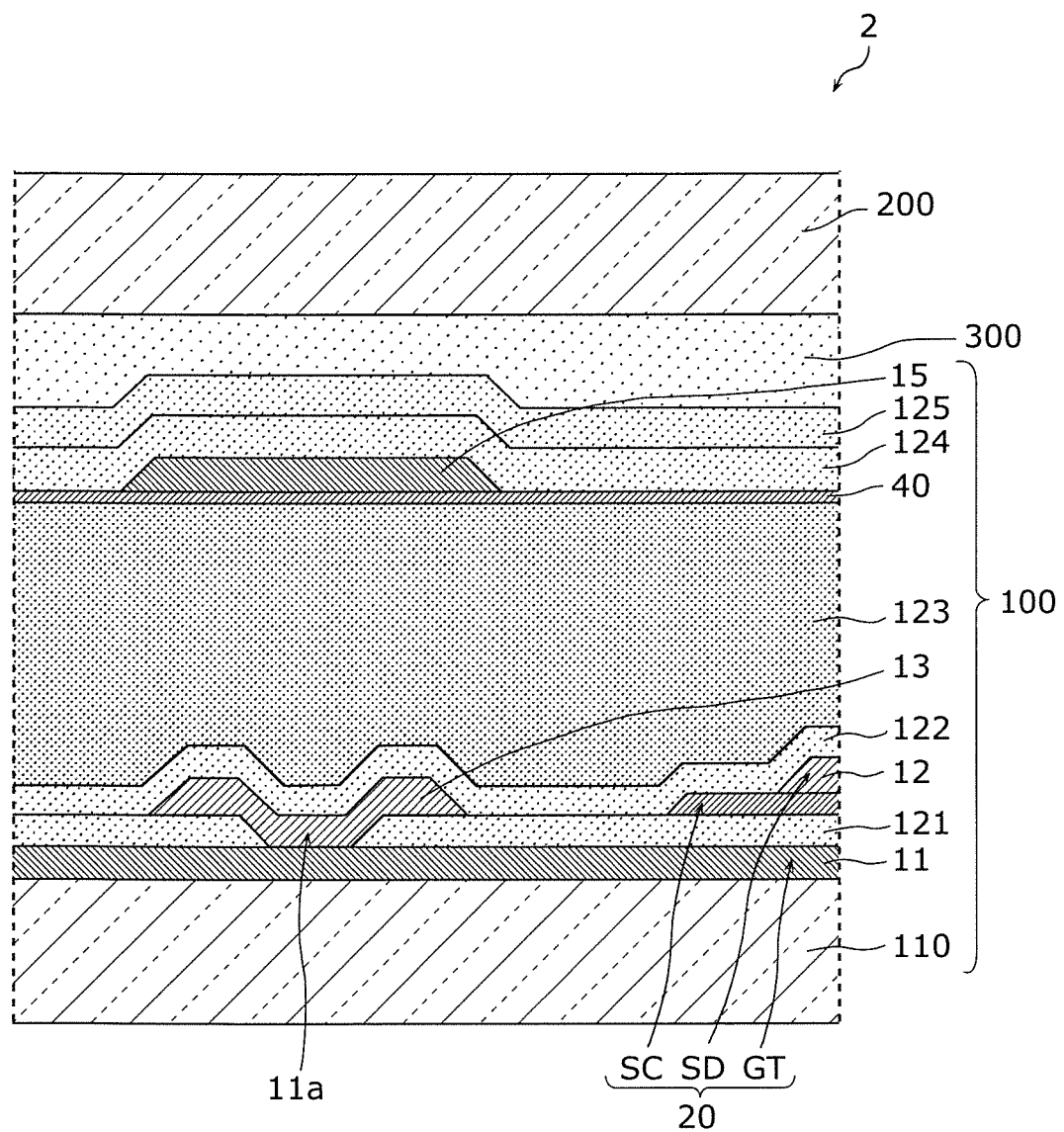
Figure 5:
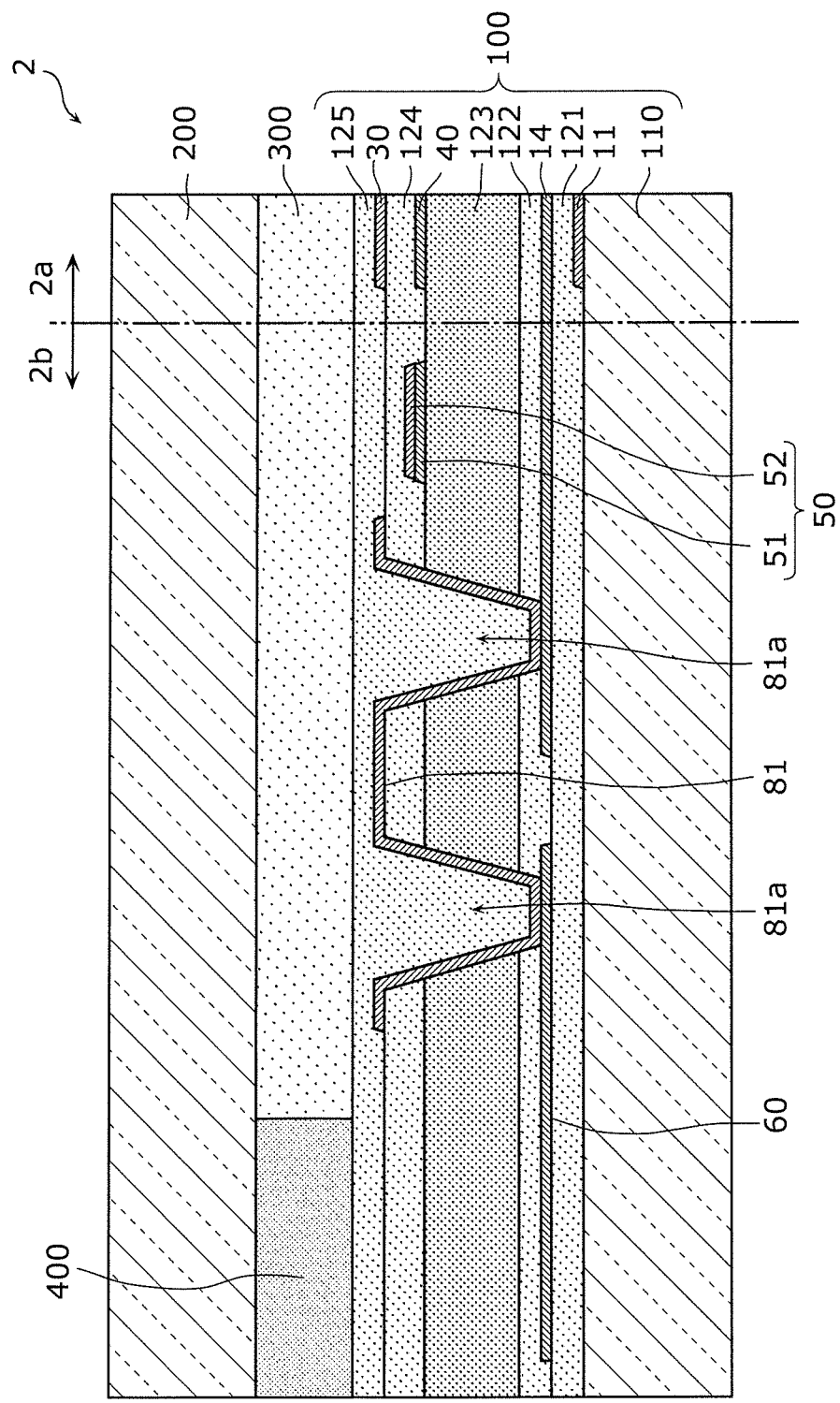
Figure 6:
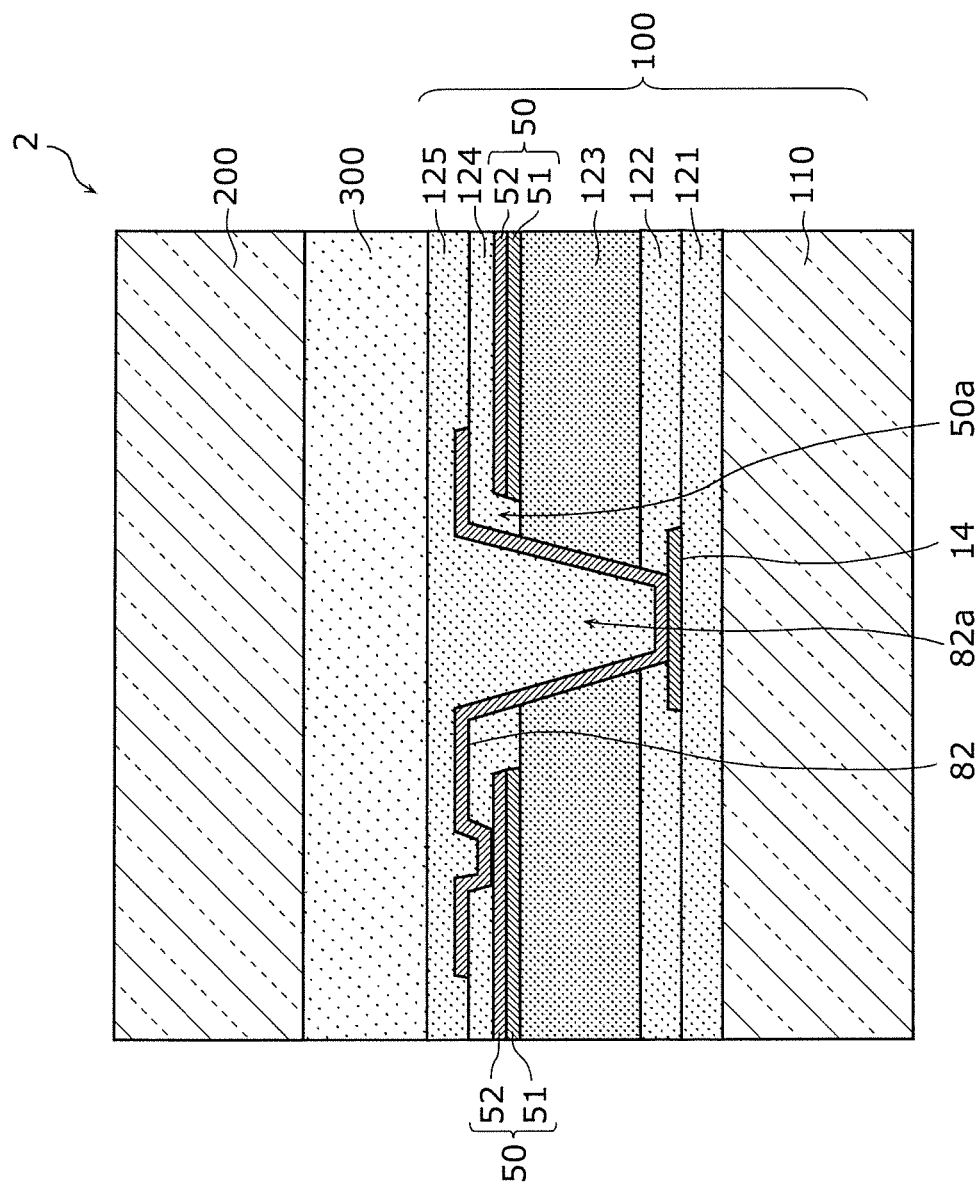
Figure 7:
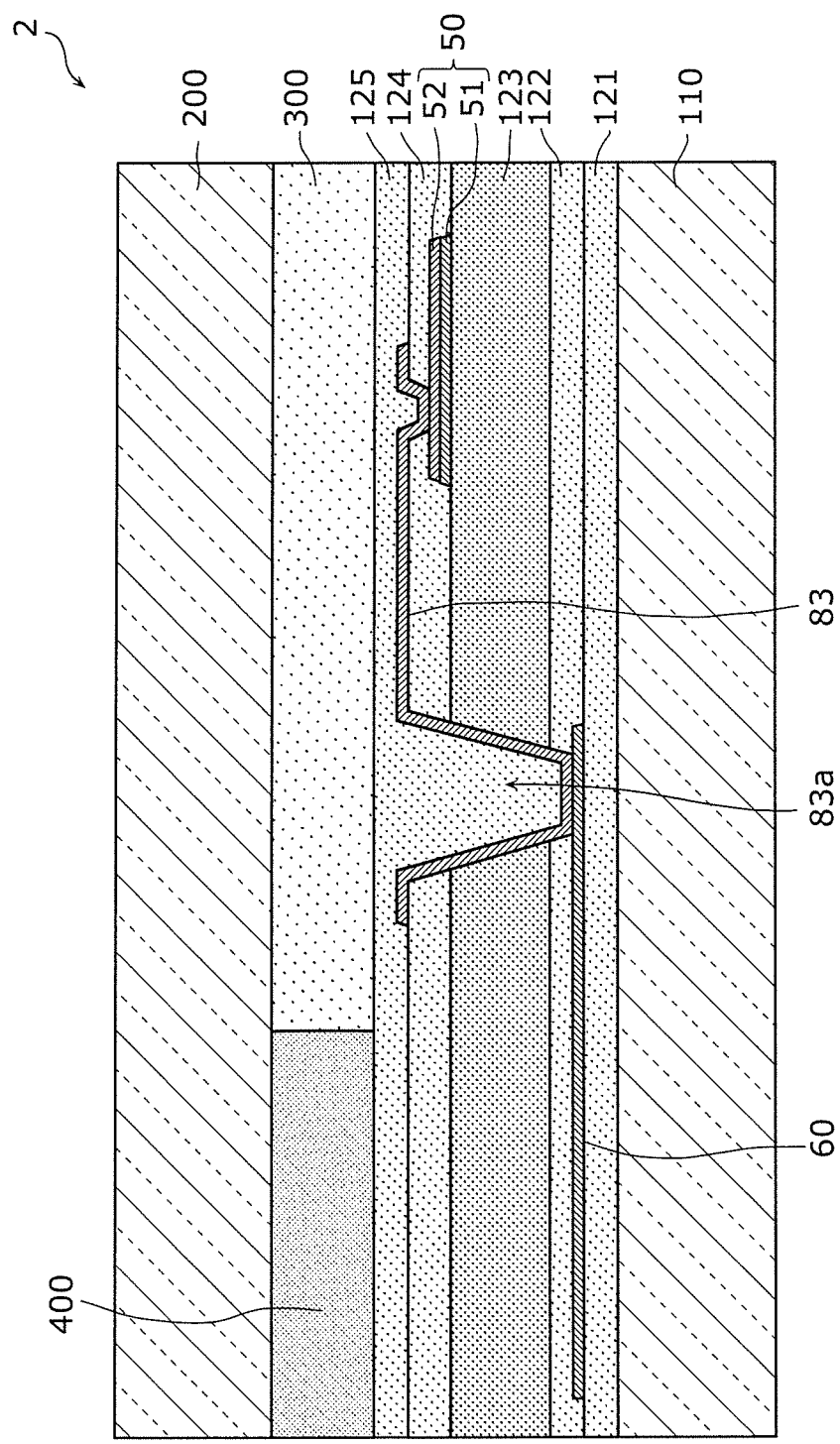
FIG. 7 is a partial sectional view of the display panel taken along line VII-VII in FIG. 1.
Figure 8:
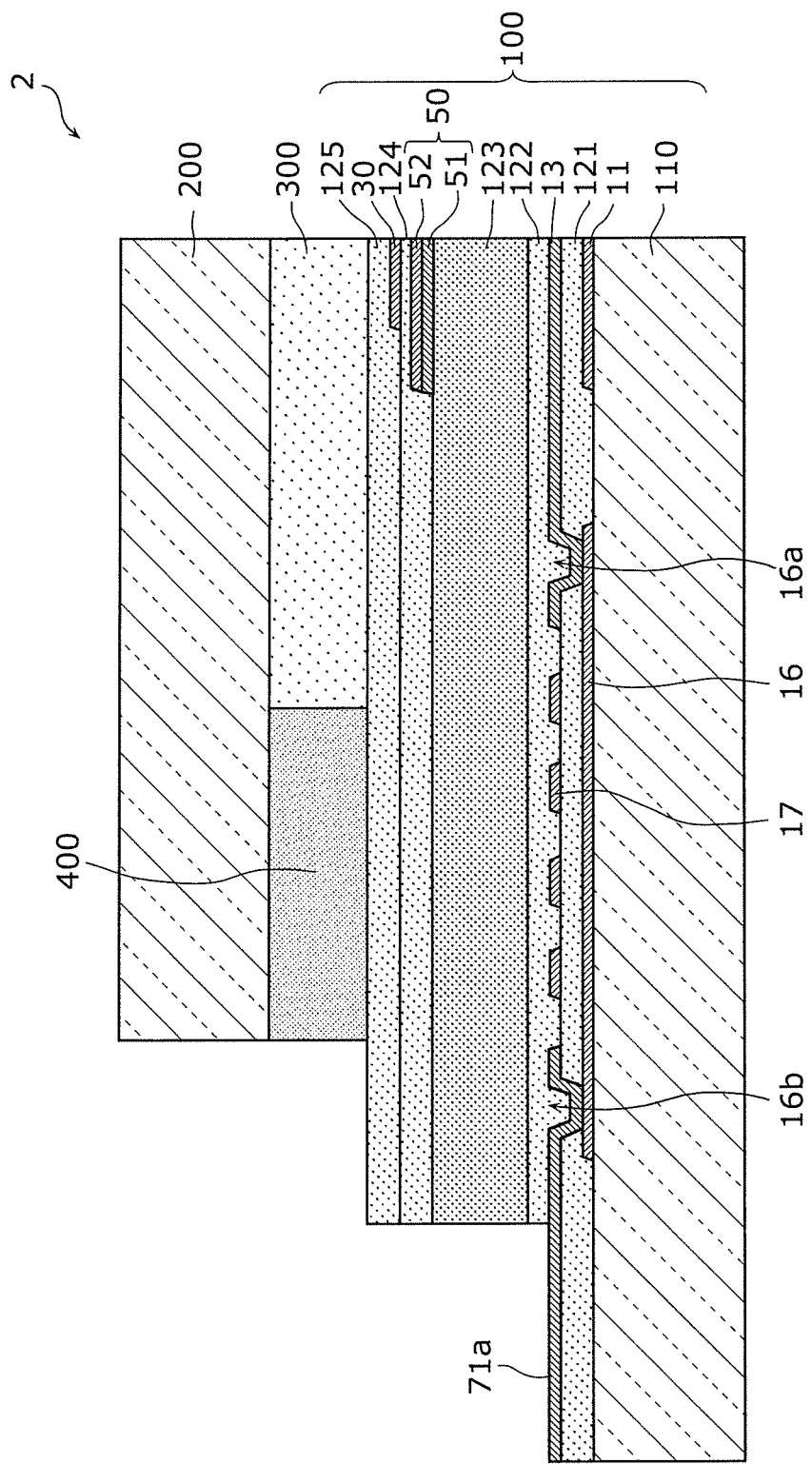
FIG. 8 is a partial sectional view of the display panel taken along line VIII-VIII in FIG. 3.

A sectional structure of display panel 2 will be described below with reference to FIGS. 4 to 8 while also referring to FIGS. 1 to 3. FIGS. 4 to 8 are partially sectional views of display panel 2 of the exemplary embodiment. FIG. 4 is a sectional view taken along line IV-IV in FIG. 2. FIG. 5 is a sectional view taken along line V-V in FIG. 1. FIG. 6 is a sectional view taken along line VI-VI in FIG. 1. FIG. 7 is a sectional view taken along line VII-VII in FIG. 1. FIG. 8 is a sectional view taken along line VIII-VIII in FIG. 3.

As illustrated in FIGS. 4 to 7, display panel 2 includes TFT substrate 100, CF substrate 200 opposed to TFT substrate 100, and liquid crystal layer 300 disposed between TFT substrate 100 and CF substrate 200. Liquid crystal layer 300 is sealed between TFT substrate 100 and CF substrate 200 by frame-shaped sealing member 400 formed in frame region 2b.

TFT 20, various wiring lines such as gate signal line 11, source signal line 12, gate lead-out line 13, dummy gate lead-out line 14, and common line 15, the interlayer insulating film formed between these wirings, pixel electrode 30, common electrode 40, common bus wiring 50, and shield electrode 60 are provided in TFT substrate 100. These members are formed on first transparent substrate 110. For example, first transparent substrate 110 is a transparent base material of a glass substrate or a transparent resin substrate.

As illustrated in FIG. 4, TFT 20 formed on first transparent substrate 110 is constructed with gate electrode GT, the pair of source-drain electrodes SD, and semiconductor layer SC constituting a channel layer. In the exemplary embodiment, TFT 20 is a TFT having a bottom gate structure, and includes gate electrode GT formed on first transparent substrate 110, first insulating film 121 that is the gate insulator formed on gate electrode GT, and semiconductor layer SC formed above gate electrode GT with first insulating film 121 interposed therebetween. The pair of source-drain electrodes SD is formed on semiconductor layer SC.

For example, gate electrode GT may be made of a metal film having a two-layer structure of a molybdenum film and a copper film or a single-layer metal film of a copper film or the like. For example, first insulating film 121 may be made of an insulating film having a two-layer structure of a silicon oxide film and a silicon nitride film or a single-layer insulating film of a silicon oxide film or a silicon nitride film. For example, semiconductor layer SC may be made of a semiconductor film having a two-layer structure of an i-amorphous silicon film and an n-amorphous silicon film or a single-layer semiconductor film. For example, the pair of source-drain electrodes SD may be made of a metal film having a two-layer structure of a molybdenum film and a copper film or a single-layer metal film of a copper film or the like.

The materials for gate electrode GT, the pair of source-drain electrodes SD, semiconductor layer SC, and first insulating film (gate insulator) 121 are not limited to the above materials. For example, an In—Ga—Zn—O-based oxide semiconductor may be used as the material for semiconductor layer SC.

As illustrated in FIG. 4, gate signal line 11 is formed in the same layer as that of gate electrode GT. That is, gate signal line 11 and gate electrode GT are formed in the same first metal layer, and formed by patterning the same metal film. Thus, gate electrode GT and gate signal line 11 are made of the same material. In the exemplary embodiment, gate electrode GT is a part of gate signal line 11.

Source signal line 12, gate lead-out line 13, and dummy gate lead-out line 14 are formed in the same layer as the pair of source-drain electrodes SD. That is, source signal line 12, gate lead-out line 13, dummy gate lead-out line 14, and the pair of source-drain electrodes SD are formed in the same second metal layer (source-drain layer), and formed by patterning the same metal film. In the exemplary embodiment, one of the pair of source-drain electrodes SD connected to source signal line 12 is a part of source signal line 12.

As illustrated in FIG. 5, shield electrode 60 is formed on the second metal layer (source-drain layer) in which dummy gate lead-out line 14 is formed. That is, shield electrode 60 is formed in the same layer as source signal line 12, gate lead-out line 13, dummy gate lead-out line 14, and the pair of source-drain electrodes SD. Thus, shield electrode 60, source signal line 12, gate lead-out line 13, dummy gate lead-out line 14, and the pair of source-drain electrodes SD are made of the same material.

The first metal layer in which gate signal line 11 and gate electrode GT are formed is located below the second metal layer in which source signal line 12 and gate lead-out line 13 are formed. Thus, gate signal line 11 and gate electrode GT are formed in the metal layer different from that of source signal line 12, gate lead-out line 13, dummy gate lead-out line 14, the pair of source-drain electrodes SD, and shield electrode 60.

As illustrated in FIGS. 2 and 4, gate signal line 11 and gate lead-out line 13 formed in different metal layers are connected to each other through gate contact hole 11a. Gate contact hole 11a is a contact portion between gate signal line 11 and gate lead-out line 13, and is made in first insulating film 121 between the first metal layer in which gate signal line 11 is formed and the second metal layer in which gate lead-out line 13 is formed as illustrated in FIG. 4.

As illustrated in FIGS. 4 to 8, second insulating film 122 is formed above first transparent substrate 110 so as to cover source signal line 12, gate lead-out line 13, dummy gate lead-out line 14, and shield electrode 60. Specifically, second insulating film 122 covers the second metal layer formed on first insulating film 121. Second insulating film 122 is constructed with an inorganic insulating film made of an inorganic material such as a silicon nitride film. For example, second insulating film 122 that is the inorganic insulating film can be deposited by a chemical vapor deposition (CVD) method.

Third insulating film 123 is formed so as to cover second insulating film 122. In the exemplary embodiment, a thickness of third insulating film 123 is larger than a thickness of second insulating film 122. Specifically, the thickness of third insulating film 123 is greater than or equal to 10 times the thickness of second insulating film 122. As an example, third insulating film 123 has the thickness of 3000 nm. Consequently, a distance in a thickness direction between the wiring such as gate signal line 11 and source signal line 12 and common electrode 40 can be increased, so that parasitic capacitance generated by the wiring line such as gate signal line 11 and source signal line 12 and common electrode 40 can be reduced. Additionally, the TFT layer having a laminated structure in which TFT 20, gate signal line 11, and source signal line 12 are formed can be planarized by thickening third insulating film 123. Consequently, third insulating film 123 in which the surface is planarized can be formed, so that common electrode 40 immediately above third insulating film 123 can be formed into a planar shape.

In the exemplary embodiment, third insulating film 123 is constructed with an organic insulating film made of an organic material containing carbon. For example, third insulating film 123 that is the organic insulating film can be formed by applying and curing a liquid organic material. Consequently, third insulating film 123 can easily be thickened, so that the surface of third insulating film 123 can easily be planarized over all pixels PX. That is, third insulating film 123 functions as a planarization layer.

Common electrode 40 and pixel electrode 30 formed on TFT substrate 100 are laminated while opposed to each other with fourth insulating film 124 interposed therebetween. In the exemplary embodiment, pixel electrode 30 is located above common electrode 40. That is, common electrode 40 is located below pixel electrode 30.

Specifically, common electrode 40 is formed on third insulating film 123, and fourth insulating film 124 is formed so as to cover common electrode 40. Then, pixel electrode 30 is formed in a predetermined shape on fourth insulating film 124. Pixel electrode 30 is formed in a comb shape for each pixel PX as an example, but is not limited to the comb shape.

Common electrode 40 and pixel electrode 30 are a transparent electrode made of a transparent metal oxide such as indium tin oxide (ITO). Fourth insulating film 124 is made of an inorganic insulating film such as a silicon nitride film. For example, fourth insulating film 124 that is the inorganic insulating film can be formed by a CVD method.

As described above, common electrode 40 is a planar solid electrode formed over all pixels PX. Consequently, the wirings such as gate signal line 11 and source signal line 12 are covered with common electrode 40, so that an electric field generated in the wirings such as gate signal line 11 and source signal line 12 can be shielded by common electrode 40. That is, the electric field generated in the TFT layer can be shielded by common electrode 40. Thus, a flexibility in designing the shape and size of pixel electrode 30 formed on common electrode 40 is improved, so that transmittance and an aperture ratio of pixel PX can easily be improved.

Common electrode 40 is a thin-film planar solid electrode. However, as illustrated in FIG. 2, opening 40a is formed on gate signal line 11 in common electrode 40 in order to connect source-drain electrode SD of TFT 20 and pixel electrode 30. Thus, the contact hole piercing the insulating layer having the three-layer structure of second insulating film 122, third insulating film 123, and fourth insulating film 124 is made in opening 40a of common electrode 40, and source-drain electrode SD of TFT 20 and pixel electrode 30 are connected to each other through the contact hole in each pixel PX.

As illustrated in FIG. 4, a plurality of common lines 15 are formed on common electrode 40. In the exemplary embodiment, each common line 15 is provided immediately above common electrode 40. That is, each common line 15 is laminated on common electrode 40 while being in contact with common electrode 40. Thus, fourth insulating film 124 covers not only common electrode 40 but also common line 15 laminated on common electrode 40.

Each common line 15 is made of a material having a resistance lower than that of common electrode 40. For example, common line 15 is a light-shielding and conductive metal film made of a metal material. In the exemplary embodiment, common line 15 is made of a copper film. Thus, a time constant of common electrode 40 can be decreased by laminating common line 15 on common electrode 40.

The common potential is applied to common line 15 through common bus wiring 50. As illustrated in FIG. 5, common bus wiring 50 includes first layer 51 formed in the same layer as common electrode 40 and second layer 52 that is laminated on first layer 51 and formed in the same layer as common line 15. Thus, first layer 51 is made of the same material as common electrode 40, and second layer 52 is made of the same material as common line 15. Common bus wiring 50 is covered with fourth insulating film 124 similarly to common electrode 40 and common line 15.

Fifth insulating film 125 is formed on pixel electrode 30. Fifth insulating film 125 is formed on fourth insulating film 124 so as to cover pixel electrode 30. In the exemplary embodiment, fifth insulating film 125 is formed over all pixels PX.

Fifth insulating film 125 is an inorganic insulating film made of an inorganic material or an organic insulating film made of an organic material. Fifth insulating film 125 may be an alignment film made of an organic insulating film. The alignment film is in contact with liquid crystal layer 300, and controls an initial alignment angle of liquid crystal molecules in liquid crystal layer 300. Specifically, the alignment film is subjected to a rubbing treatment in order to align the initial alignment angles of the liquid crystal molecules in a certain direction. When fifth insulating film 125 is not the alignment film, the alignment film may be separately formed on fifth insulating film 125.

In the exemplary embodiment, first insulating film 121, second insulating film 122, third insulating film 123, fourth insulating film 124, and fifth insulating film 125 are formed not only in pixel region 2a but also in frame region 2b. Specifically, first insulating film 121, second insulating film 122, third insulating film 123, fourth insulating film 124, and fifth insulating film 125 are formed on the whole surface of first transparent substrate 110.

A connection relationship between various wirings and electrodes will be described in detail below. The connection relationship between members to which the common potential is applied will be described in detail. In the exemplary embodiment, the common potential is applied to dummy gate lead-out line 14, common line 15, common electrode 40, common bus wiring 50, and shield electrode 60.

As illustrated in FIG. 1, display panel 2 (TFT substrate 100) includes a plurality of first connection wirings 81 that connects the plurality of dummy gate lead-out lines 14 and shield electrode 60, respectively. That is, each dummy gate lead-out line 14 and shield electrode 60 are connected to each other through first connection wiring 81. Specifically, one end of dummy gate lead-out line 14 is connected to shield electrode 60 by first connection wiring 81.

As illustrated in FIG. 5, the plurality of first connection wirings 81 connects the plurality of dummy gate lead-out lines 14 and shield electrode 60 through a plurality of first contact holes 81a made in frame region 2b, respectively. Consequently, the common potential can be applied to the plurality of dummy gate lead-out lines 14 through shield electrode 60.

In the exemplary embodiment, the first connection wiring 81 is formed in the same layer as the pixel electrode 30. Thus, first connection wiring 81 is made of the same material as pixel electrode 30. As described above, when first connection wiring 81 that connects dummy gate lead-out line 14 and shield electrode 60 is formed in the same layer as pixel electrode 30, first contact hole 81a is made so as to pierce second insulating film 122, third insulating film 123, and fourth insulating film 124.

In this case, first contact hole 81a can be made at the same time as a process of making the contact hole connecting pixel electrode 30 and the source-drain electrode of TFT 20. Consequently, first contact hole 81a can be made without increasing the number of photomasks. First connection wiring 81 can be formed in a predetermined shape at the same time as a process of patterning pixel electrode 30. First contact hole 81a is made in at least two points on each of dummy gate lead-out lines 14 and shield electrode 60 with respect to one first connection wiring 81.

In the exemplary embodiment, first contact hole 81a is made in the other long side (the upper long side in FIG. 1) of the pair of long sides in frame region 2b. That is, first contact hole 81a is made in the long side on the opposite side to the long side (the lower long side in FIG. 1) in which gate terminal 71 and source terminal 72 are provided. Thus, first connection wiring 81 is formed in the long side on the opposite side to the long side in which gate terminal 71 and source terminal 72 are provided.

On the other hand, as illustrated in FIG. 1, in the long side in which gate terminal 71 and source terminal 72 are provided (the lower long side in FIG. 1), the other end of dummy gate lead-out line 14 is connected to common bus wiring 50 to which the common potential is applied. Specifically, display panel 2 (TFT substrate 100) includes a plurality of second connection wirings 82 that connects the plurality of dummy gate lead-out lines 14 and common bus wiring 50, respectively. That is, the other end of each dummy gate lead-out line 14 and common bus wiring 50 are connected to each other through second connection wiring 82. As illustrated in FIG. 6, the plurality of second connection wirings 82 connects the plurality of dummy gate lead-out lines 14 and common bus wiring 50 through a plurality of second contact holes 82a made in frame region 2b, respectively. Specifically, second connection wiring 82 is connected to second layer 52 by contacting with the top surface of second layer 52 in the upper layer of common bus wiring 50.

In the exemplary embodiment, second connection wiring 82 is formed in the same layer as pixel electrode 30. That is, second connection wiring 82 is formed in the same layer as first connection wiring 81. Thus, similarly to first connection wiring 81, second connection wiring 82 is made of the same material as pixel electrode 30. In this way, when second connection wiring 82 that connects dummy gate lead-out line 14 and common bus wiring 50 is formed in the same layer as pixel electrode 30, second contact hole 82a is made so as to pierce second insulating film 122, third insulating film 123, and fourth insulating film 124 similarly to first contact hole 81a.

Consequently, similarly to first contact hole 81a, second contact hole 82a can be made at the same time as the process of making the contact hole connecting pixel electrode 30 and the source-drain electrode of TFT 20. Similarly to first connection wiring 81, second connection wiring 82 can be formed in a predetermined shape at the same time as the process of patterning pixel electrode 30. That is, first connection wiring 81 and second connection wiring 82 can be formed by the same process.

While two first contact holes 81a are made for one first connection wiring 81, one second contact hole 82a is made for one second connection wiring 82. Specifically, common bus wiring 50 includes opening 50a, and second contact hole 82a is made in opening 50a. Opening 50a of common bus wiring 50 can be formed by the process of patterning common bus wiring 50.

In the exemplary embodiment, second contact hole 82a is made in one long side (the lower long side in FIG. 1) of the pair of long sides in frame region 2b. That is, second contact hole 82a is made in the long side in which gate terminal 71 and source terminal 72 are provided. Thus, second connection wiring 82 is formed in the long side in which gate terminal 71 and source terminal 72 are provided.

In this way, one end of dummy gate lead-out line 14 is connected to shield electrode 60 by first connection wiring 81, and the other end is connected to common bus wiring 50 by second connection wiring 82. That is, dummy gate lead-out line 14 is connected to shield electrode 60 and common bus wiring 50 to which the common potential is applied, and the common potential is applied to dummy gate lead-out line 14 from both the ends. The common potential may not be applied to dummy gate lead-out line 14 from both the ends, and may be applied to dummy gate lead-out line 14 only from one of the ends. That is, it is only necessary to provide at least one of first connection wiring 81 and second connection wiring 82.

As illustrated in FIG. 1, common bus wiring 50 and shield electrode 60 are connected to each other. Specifically, display panel 2 (TFT substrate 100) includes common connection wiring 83 (third connection wiring) that connects common bus wiring 50 and shield electrode 60. That is, common bus wiring 50 and shield electrode 60 are connected to each other through common connection wiring 83. As illustrated in FIG. 7, common connection wiring 83 connects common bus wiring 50 and shield electrode 60 through contact hole 83a made in frame region 2b.

In the exemplary embodiment, common connection wiring 83 is formed in the same layer as pixel electrode 30. That is, common connection wiring 83 is formed in the same layer as first connection wiring 81 and second connection wiring 82. Thus, similarly to first contact hole 81a and second contact hole 82a, contact hole 83a is made so as to pierce second insulating film 122, third insulating film 123, and fourth insulating film 124. Consequently, similarly to first contact hole 81a and second contact hole 82a, contact hole 83a can be made at the same time as the process of forming the contact hole for connecting pixel electrode 30 and the source-drain electrode of TFT 20. Similarly to first connection wiring 81 and second connection wiring 82, common connection wiring 83 can be formed in a predetermined shape at the same time as the process of patterning pixel electrode 30. That is, first connection wiring 81, second connection wiring 82, and common connection wiring 83 can be formed by the same process.

The connection relation of wirings around gate terminal 71 and source terminal 72 will be described below.

As illustrated in FIG. 8, gate lead-out line 13 is formed in the same layer as source signal line 12, and gate signal line 11 is formed in a different layer from source signal line 12. Gate relay wiring 16 is formed in the same layer as gate signal line 11. Thus, gate relay wiring 16 is connected to each of gate lead-out line 13 and gate terminal electrode 71a through contact holes 16a and 16b made in first insulating film 121. Consequently, gate relay wiring 16 and gate relay wiring 17 can intersect three-dimensionally with each other.

The method for routing gate relay wiring 16 is not limited to the method in FIG. 8. For example, gate relay wiring 16 may be returned to the original metal layer after routed to the metal layer in which common electrode 40 or pixel electrode 30 is formed through the contact hole and connected to gate lead-out line 13.

CF substrate 200 will be described below. As illustrated in FIGS. 4 to 8, CF substrate 200 is a counter substrate opposed to TFT substrate 100. In the exemplary embodiment, CF substrate 200 is a color filter substrate including a color filter.

Although not illustrated, CF substrate 200 includes a second transparent substrate made of a transparent base material such as a glass substrate or a transparent resin substrate, and a color filter layer and a light shielding layer formed on the second transparent substrate.

The color filter layer includes the color filter corresponding to each pixel PX. Specifically, the color filter layer includes a red color filter corresponding to red pixel PXR, a green color filter corresponding to green pixel PXG, and a blue color filter corresponding to blue pixel PXB. The color filter is formed in the region between the light shielding layers (that is, an opening of the light shielding layer).

The light shielding layer is a black layer. For example, the light shielding layer is made of carbon black. The light shielding layer is formed at each boundary between two pixels PX adjacent to each other in the column direction. Specifically, the light shielding layer is formed in a line shape along the row direction so as to cover at least gate signal line 11. The light shielding layer may be formed in a line shape along the column direction so as to cover gate lead-out line 13 and source signal line 12. In this case, the light shielding layer is a black matrix formed in a lattice shape.

A pair of polarizing plates (not illustrated) is bonded to display panel 2 having the above configuration. For example, one of the pair of polarizing plates is formed on the outer surface of TFT substrate 100, and the other of the pair of polarizing plates is formed on the outer surface of CF substrate 200. The pair of polarizing plates is disposed such that polarization directions of the polarizing plates are orthogonal to each other. A phase difference plate may be bonded to the pair of polarizing plates.

In display panel 2, TFT substrate 100 is located on the side of backlight BL, and CF substrate 200 is located on an observer side. That is, in display panel 2, CF substrate 200 is disposed in front of TFT substrate 100.

As described above, display panel 2 and TFT substrate 100 of the exemplary embodiment include the plurality of gate signal lines 11, the plurality of gate lead-out lines 13 and the plurality of dummy gate lead-out lines 14 intersecting with the plurality of gate signal lines 11, and the common potential is applied to the plurality of dummy gate lead-out lines 14. In the exemplary embodiment, the common potential is applied to the plurality of dummy gate lead-out lines 14 using shield electrode 60 and common bus wiring 50 to which the common potential is applied. Specifically, the common potential is applied to the plurality of dummy gate lead-out lines 14 by connecting the plurality of dummy gate lead-out lines 14 to shield electrode 60 and common bus wiring 50.

Consequently, the common potential is applied as a predetermined potential to the plurality of dummy gate lead-out lines 14 even if the plurality of dummy gate lead-out lines 14 are not connected to gate terminal 71 or source terminal 72 while brought to frame region 2b. Thus, a flexibility of layout of various wirings such as gate lead-out line 13, dummy gate lead-out line 14, and source signal line 12 in frame region 2b can be prevented from decreasing as compared with the case where the plurality of dummy gate lead-out lines 14 are routed while brought to frame region 2b.

Display panel 2 and TFT substrate 100 of the exemplary embodiment include the plurality of gate signal lines 11, the plurality of gate lead-out lines 13 and the plurality of dummy gate lead-out lines 14 intersecting with the plurality of gate signal lines 11. When pixel region 2a is divided into at least three of first region A1, second region A2, and third region A3 along the first direction, the plurality of gate lead-out lines 13 are formed in second region A2, and the plurality of dummy gate lead-out lines 14 are formed in each of first region A1 and third region A3.

In this way, a ratio at which various wirings such as gate lead-out line 13, dummy gate lead-out line 14, and source signal line 12 intersect with each other can be decreased by separating the region where gate lead-out line 13 is formed from the region where the dummy gate lead-out line 14 is formed, when the various wirings are connected to gate terminal 71 or source terminal 72 while brought to frame region 2b. Thus, the flexibility of the layout of various wirings such as gate lead-out line 13, dummy gate lead-out line 14, and source signal line 12 in frame region 2b can be prevented from decreasing.

In particular, when gate terminal 71 and source terminal 72 are provided in the same side of frame region 2b, various wirings such as gate lead-out line 13 and source signal line 12 are concentrated on one side to increase a restriction of the wiring layout. Additionally, when gate driver 3a and source driver 3b are directly mounted on frame region 2b by the COG method as in the exemplary embodiment, not only the flexibility of the layout of gate driver 3a and source driver 3b is decreased, but also the flexibility of the wiring layout of various wirings such as gate lead-out line 13 and source signal line 12 is further decreased.

On the other hand, in display panel 2 and TFT substrate 100 of the exemplary embodiment, the common potential is applied to the plurality of dummy gate lead-out lines 14 using shield electrode 60 and common bus wiring 50 to which the common potential is applied. Consequently, even if gate terminal 71 and source terminal 72 are provided in the same side of frame region 2b, or even if gate driver 3a and source driver 3b are directly mounted on frame region 2b by the COG method, the flexibility of the wiring layout of various wirings such as gate lead-out line 13 and source signal line 12 can effectively be prevented from decreasing.

In display panel 2 and TFT substrate 100 of the exemplary embodiment, the region where gate lead-out line 13 is formed and the region where dummy gate lead-out line 14 is formed are divided from each other. Consequently, even if gate terminal 71 and source terminal 72 are provided in the same side of frame region 2b, or even if gate driver 3a and source driver 3b are directly mounted on frame region 2b by the COG method, the flexibility of the wiring layout of various wirings such as gate lead-out line 13 and source signal line 12 can effectively be prevented from decreasing.

In display panel 2 and TFT substrate 100 of the exemplary embodiment, the common potential is applied to the plurality of dummy gate lead-out lines 14. In the exemplary embodiment, the common potential is applied to the plurality of dummy gate lead-out lines 14 using shield electrode 60 and common bus wiring 50 to which the common potential is applied. Specifically, the common potential is applied to the plurality of dummy gate lead-out lines 14 by connecting the plurality of dummy gate lead-out lines 14 to shield electrode 60 and common bus wiring 50.

Consequently, the common potential is applied as a predetermined potential to the plurality of dummy gate lead-out lines 14 even if the plurality of dummy gate lead-out lines 14 are not connected to gate terminal 71 or source terminal 72 while brought to frame region 2b. Thus, the flexibility of the layout of various wirings such as gate lead-out line 13, dummy gate lead-out line 14, and source signal line 12 in frame region 2b can further be prevented from decreasing as compared with the case where the plurality of dummy gate lead-out lines 14 are routed while brought to frame region 2b.

As described above, in the exemplary embodiment, even if TFT substrate 100 and display panel 2 have the structure in which the plurality of gate signal lines 11 intersect with the plurality of gate lead-out lines 13 and the plurality of dummy gate lead-out lines 14, TFT substrate 100 and the display panel 2 having the high flexibility of the wiring layout can be constructed.

(First Modification)

Figure 9:
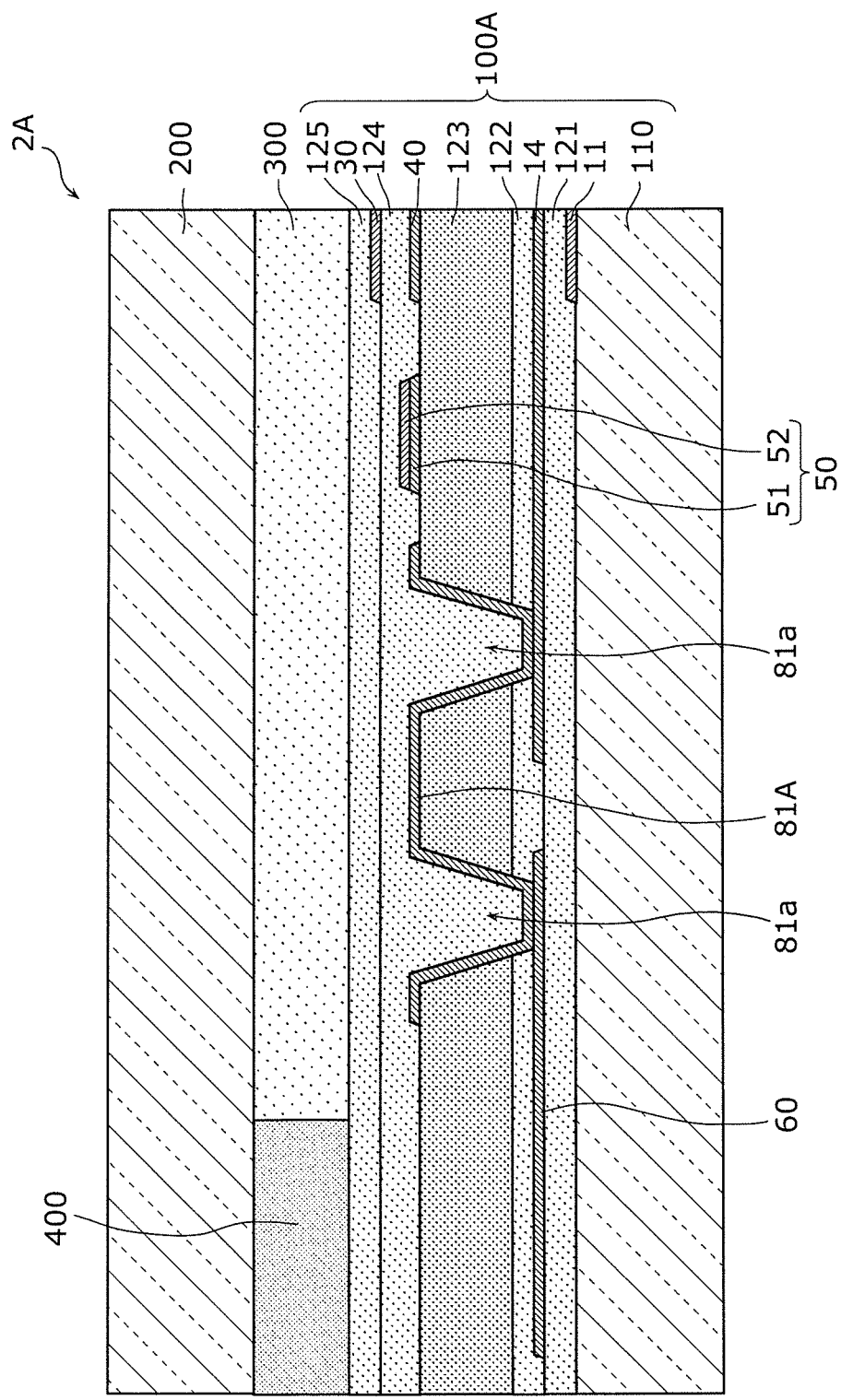
FIG. 9 is a partial sectional view of a display panel according to a first variation.

A first modification of the exemplary embodiment will be described below with reference to FIG. 9. FIG. 9 is a partially sectional view illustrating display panel 2A according to the first modification. FIG. 9 corresponds to the section of display panel 2 in FIG. 5 of the exemplary embodiment. In the first modification, the configuration except for first connection wiring 81A is the same as the exemplary embodiment.

In display panel 2 and TFT substrate 100 of the exemplary embodiment, first connection wiring 81 connecting dummy gate lead-out line 14 and shield electrode 60 is formed in the same layer as pixel electrode 30. On the other hand, as illustrated in FIG. 9, in display panel 2A and TFT substrate 100A of the first modification, first connection wiring 81A connecting dummy gate lead-out line 14 and shield electrode 60 is formed in the same layer as common electrode 40. Thus, first connection wiring 81A is made of the same material as common electrode 40.

As described above, when first connection wiring 81A connecting dummy gate lead-out line 14 and shield electrode 60 is formed in the same layer as common electrode 40, first contact hole 81a is made so as to pierce second insulating film 122 and third insulating film 123.

As described above, even in display panel 2A and TFT substrate 100A of the first modification, similarly to display panel 2 and TFT substrate 100 of the exemplary embodiment, the common potential is applied to the plurality of dummy gate lead-out lines 14 using shield electrode 60 and common bus wiring 50 to which the common potential is applied. Consequently, the flexibility of the wiring layout of various wirings such as gate lead-out line 13 and source signal line 12 can be prevented from decreasing, and display panel 2A and TFT substrate 100A having the high flexibility of the wiring layout can be constructed.

(Second Modification)

Figure 10:
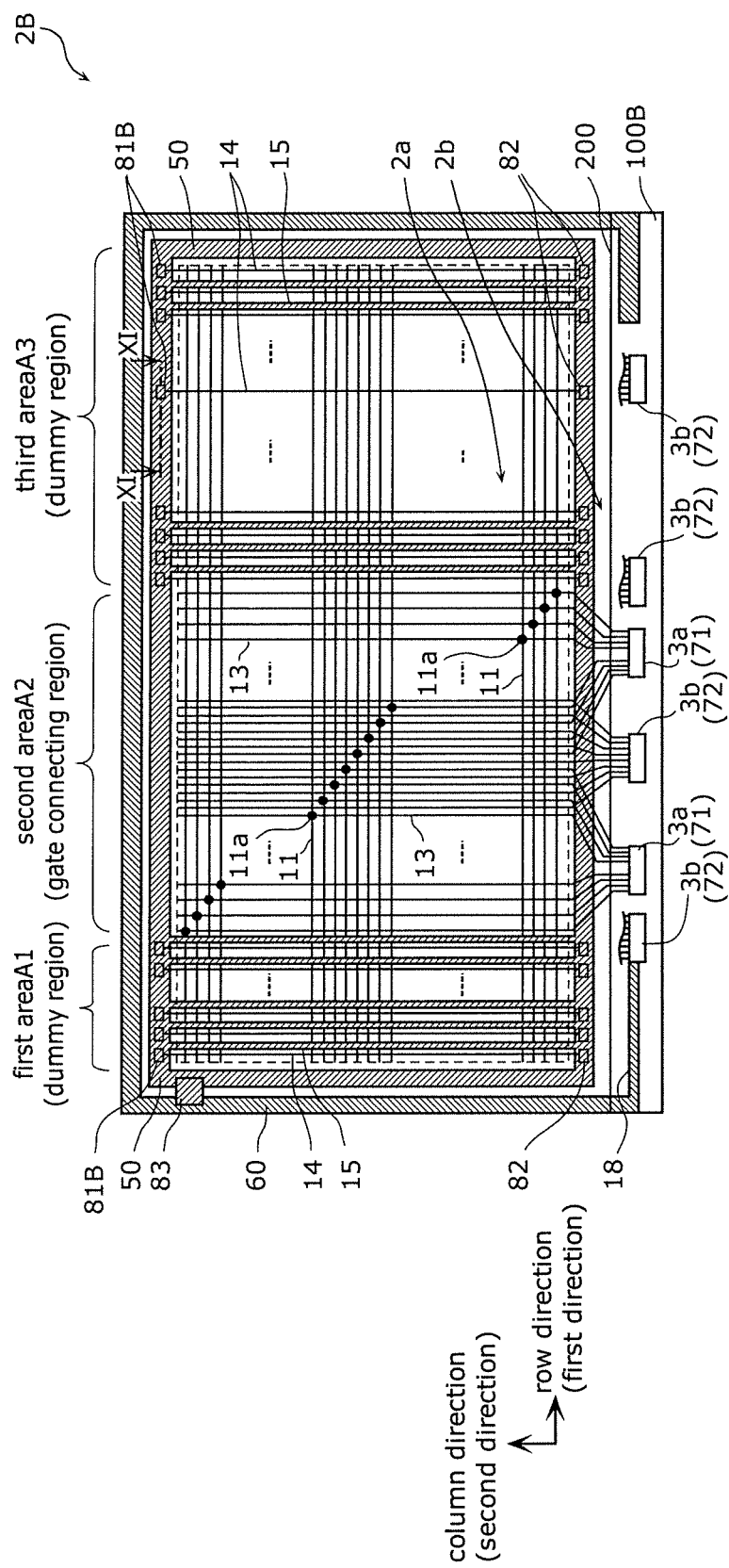
FIG. 10 is a plan view illustrating a configuration of a display panel of a second exemplary embodiment.
Figure 11:
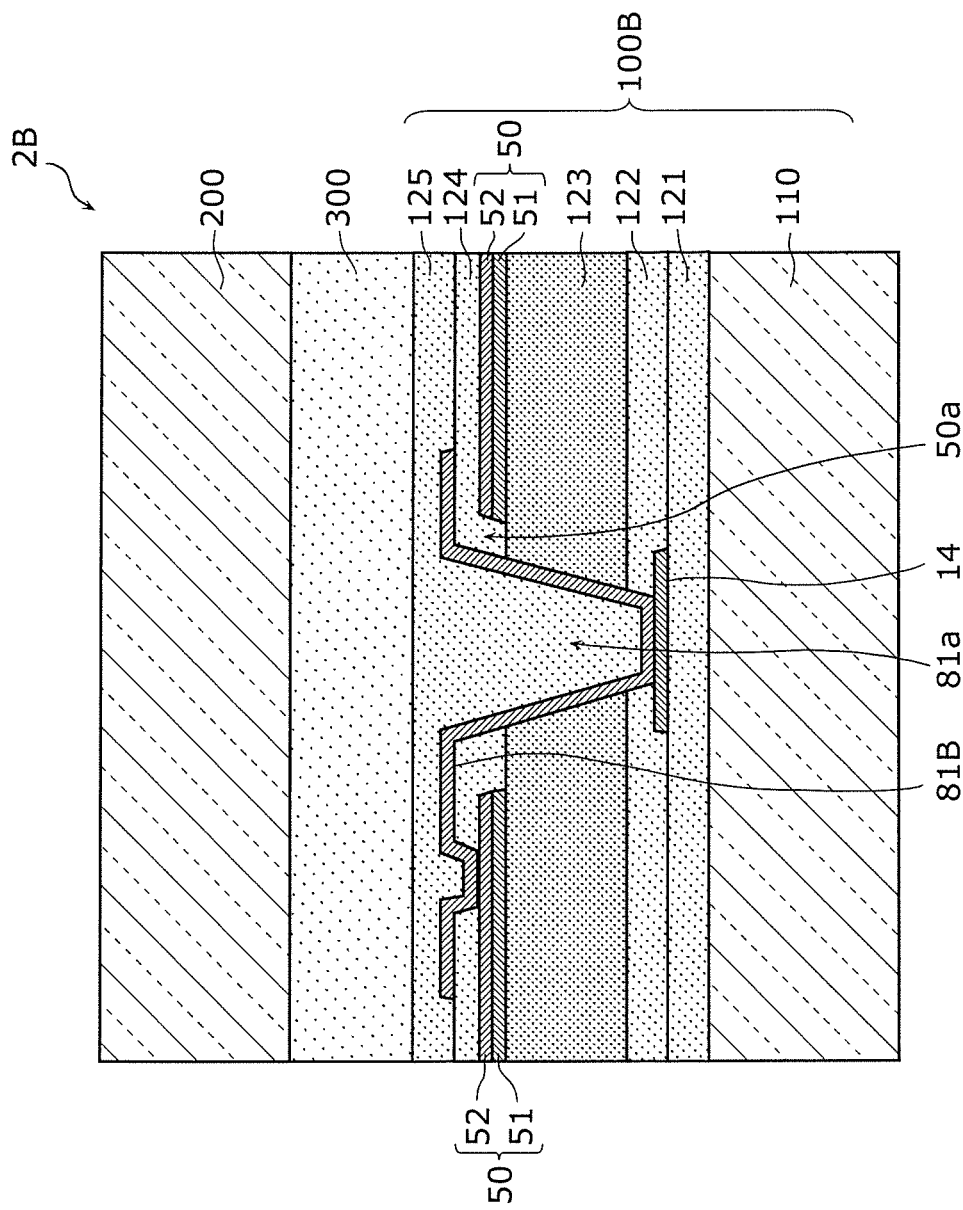
FIG. 11 is a partial sectional view of the display panel taken along line XI-XI in FIG. 10.

A second modification of the exemplary embodiment will be described below with reference to FIGS. 10 and 11. FIG. 10 is a plan view illustrating a schematic configuration of display panel 2B according to the second modification. FIG. 11 is a partially sectional view taken along line XI-XI in FIG. 10. FIG. 11 corresponds to the section of display panel 2 in FIG. 6 of the exemplary embodiment. In the second modification, the configuration except for first connection wiring 81B is the same as the exemplary embodiment.

In display panel 2 and TFT substrate 100 of the exemplary embodiment, first connection wiring 81 connects dummy gate lead-out line 14 and shield electrode 60. On the other hand, as illustrated in FIGS. 10 and 11, in display panel 2B and TFT substrate 100B of the second modification, first connection wiring 81B connects dummy gate lead-out line 14 and common bus wiring 50.

That is, in the second modification, both the ends of each dummy gate lead-out line 14 are connected to common bus wiring 50. Specifically, in each dummy gate lead-out line 14, one end is connected to common bus wiring 50 through first contact hole 81a by first connection wiring 81A, and the other end is connected to common bus wiring 50 through second contact hole 82a by second connection wiring 82 similarly to display panel 2 and TFT substrate 100 of the exemplary embodiment. Both first connection wiring 81B and second connection wiring 82 are connected to second layer 52 by contacting with the top surface of second layer 52 in the upper layer of common bus wiring 50.

In the second modification, first connection wiring 81B is formed in the same layer as pixel electrode 30. That is, first connection wiring 81B is formed in the same layer as second connection wiring 82. Thus, similarly to second connection wiring 82, first connection wiring 81B is made of the same material as pixel electrode 30. In this way, at the same time as the process of patterning pixel electrode 30, first connection wiring 81B and second connection wiring 82 can be formed in a predetermined shape by forming first connection wiring 81B and second connection wiring 82 connecting dummy gate lead-out line 14 and common bus wiring 50 in the same layer as pixel electrode 30. That is, first connection wiring 81B, second connection wiring 82, and pixel electrode 30 can be formed through the same process.

As described above, even in display panel 2B and TFT substrate 100B of the second modification, similarly to display panel 2 and TFT substrate 100 of the exemplary embodiment, the common potential is applied to the plurality of dummy gate lead-out lines 14 using common bus wiring 50 to which the common potential is applied. Consequently, the flexibility of the wiring layout of various wirings such as gate lead-out line 13 and source signal line 12 can be prevented from decreasing, and display panel 2B and TFT substrate 100B having the high flexibility of the wiring layout can be constructed.

In the second modification, the common potential is applied to the plurality of dummy gate lead-out lines 14 with no use of shield electrode 60. Thus, even if shield electrode 60 is not formed in display panel 2B and TFT substrate 100B, the common potential can be applied to the plurality of dummy gate lead-out lines 14.

(Third Modification)

Figure 12:
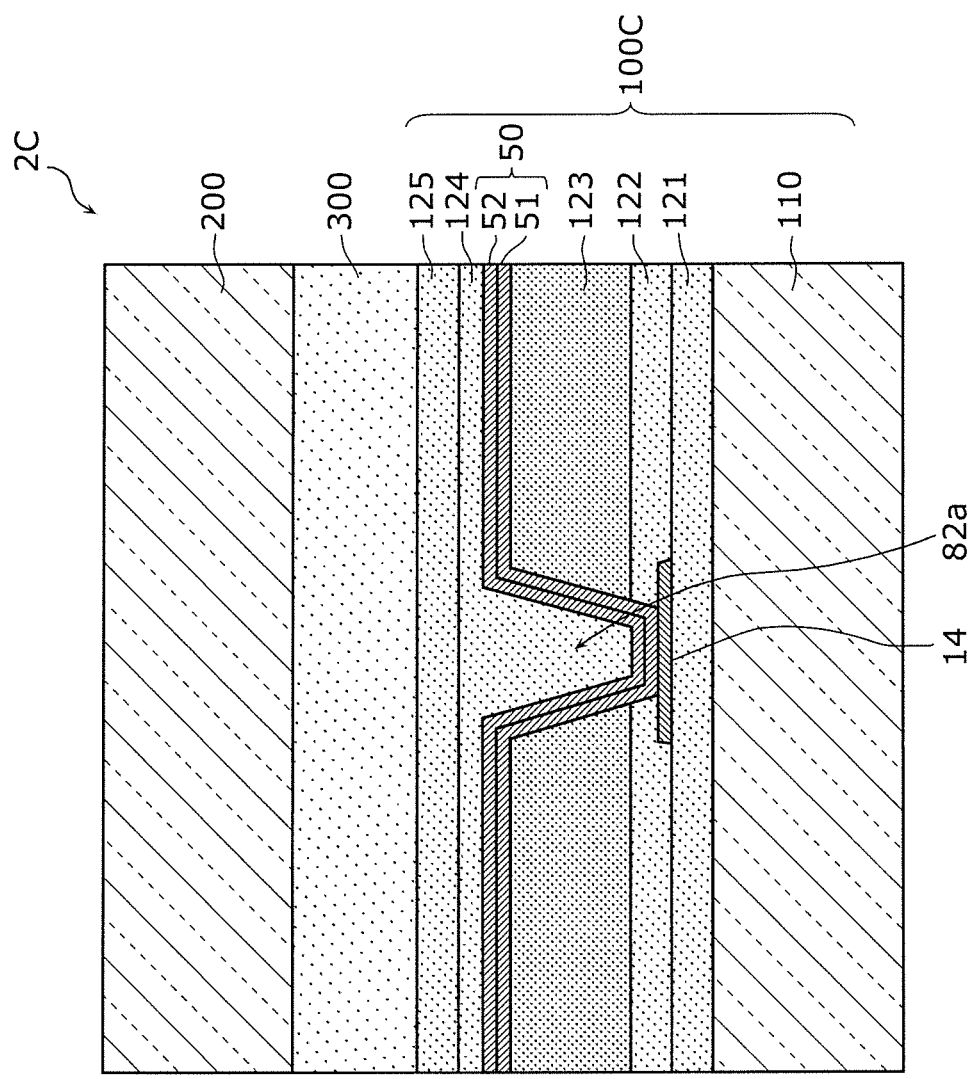
FIG. 12 is a partial sectional view of a display panel according to a third variation.

A third modification of the exemplary embodiment will be described below with reference to FIG. 12. FIG. 12 is a partially sectional view illustrating display panel 2C according to the third modification. FIG. 12 corresponds to the section of display panel 2 in FIG. 6 of the exemplary embodiment. In the third modification, the configuration except for a peripheral structure of second contact hole 82a is the same as the exemplary embodiment.

In display panel 2 and TFT substrate 100 of the exemplary embodiment, the other end of dummy gate lead-out line 14 is connected to common bus wiring 50 by second connection wiring 82. That is, a member formed in a layer different from the common bus wiring 50 is used as second connection wiring 82, and dummy gate lead-out line 14 and common bus wiring 50 are connected to each other through second connection wiring 82.

On the other hand, in display panel 2C and TFT substrate 100C of the third modification, as illustrated in FIG. 12, dummy gate lead-out line 14 and common bus wiring 50 are connected to each other with no use of the member formed in the layer different from common bus wiring 50. That is, a part of common bus wiring 50 is used as the second connection wiring, and dummy gate lead-out line 14 and common bus wiring 50 are directly connected to each other. Specifically, first layer 51 in the lower layer of common bus wiring 50 contacts with the top surface of dummy gate lead-out line 14, which allows common bus wiring 50 to be connected to dummy gate lead-out line 14.

In this case, in one long side (the long side in which gate terminal 71 and source terminal 72 are provided) of the pair of long sides in frame region 2b, the plurality of dummy gate lead-out lines 14 are directly connected to common bus wiring 50 through second contact hole 82a made in frame region 2b.

As described above, even in display panel 2C and TFT substrate 100C of the third modification, similarly to display panel 2 and TFT substrate 100 of the exemplary embodiment, the common potential is applied to the plurality of dummy gate lead-out lines 14 using common bus wiring 50 to which the common potential is applied. Consequently, the flexibility of the wiring layout of various wirings such as gate lead-out line 13 and source signal line 12 can be prevented from decreasing, and display panel 2C and TFT substrate 100C having the high flexibility of the wiring layout can be constructed.

The third modification may be applied to first contact hole 81a of the second modification. Specifically, in the other long side (the long side on the opposite side to the long side on which gate terminal 71 and source terminal 72 are provided) of the pair of long sides in frame region 2b, dummy gate lead-out line 14 and common bus wiring 50 may directly be connected to each other with no use of first connection wiring 81B.

(Fourth Modification)

Figure 13:
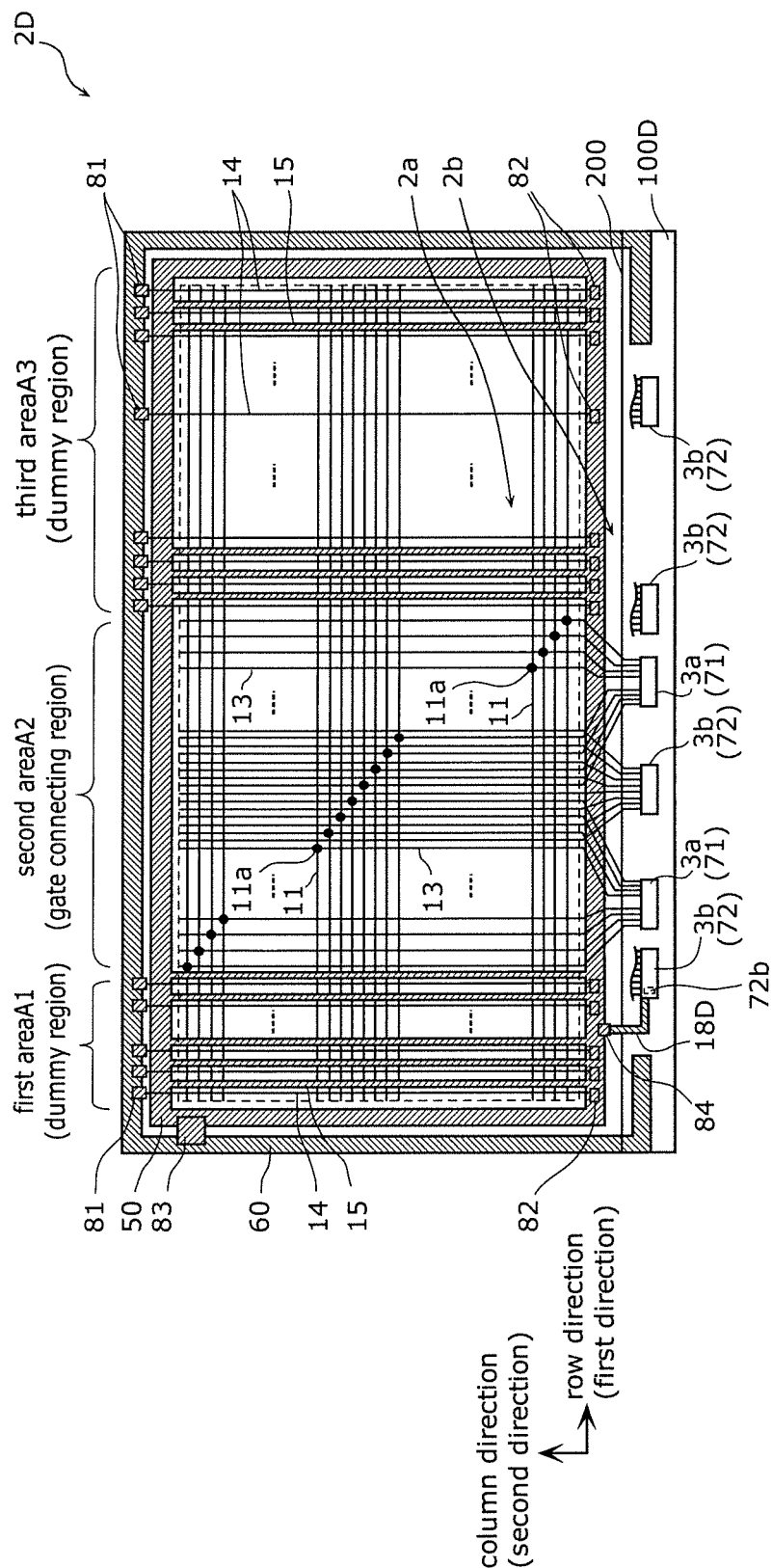
FIG. 13 is a plan view illustrating a configuration of a display panel of a forth exemplary embodiment.

A fourth modification of the exemplary embodiment will be described below with reference to FIG. 13. FIG. 13 is a plan view illustrating a schematic configuration of display panel 2D according to the fourth modification. In the fourth modification, the configuration except for common relay wiring 18 is the same as the exemplary embodiment.

In display panel 2 and TFT substrate 100 of the exemplary embodiment, common terminal electrode 72b included in source terminal 72 is connected to shield electrode 60 through common relay wiring 18. On the other hand, as illustrated in FIG. 13, in display panel 2D and TFT substrate 100D of the fourth modification, common terminal electrode 72b is connected to common bus wiring 50 through common relay wiring 18D. That is, in the fourth modification, common relay wiring 18D connects common terminal electrode 72b and common bus wiring 50.

In this case, when the common potential is input from power supply circuit 7 to common terminal electrode 72b, the common potential is applied to common bus wiring 50 through common relay wiring 18D. Consequently, the common potential is applied to dummy gate lead-out line 14 and common line 15. In the fourth modification, the common potential is applied from common bus wiring 50 to shield electrode 60 through common connection wiring 83. That is, the common potential is applied to shield electrode 60 through common bus wiring 50.

As described above, even in display panel 2D and TFT substrate 100D of the fourth modification, similarly to display panel 2 and TFT substrate 100 of the exemplary embodiment, the common potential is applied to the plurality of dummy gate lead-out lines 14 using common bus wiring 50 to which the common potential is applied. Consequently, the flexibility of the wiring layout of various wirings such as gate lead-out line 13 and source signal line 12 can be prevented from decreasing, and display panel 2D and TFT substrate 100D having the high flexibility of the wiring layout can be constructed.

(Fifth Modification)

Figure 14:
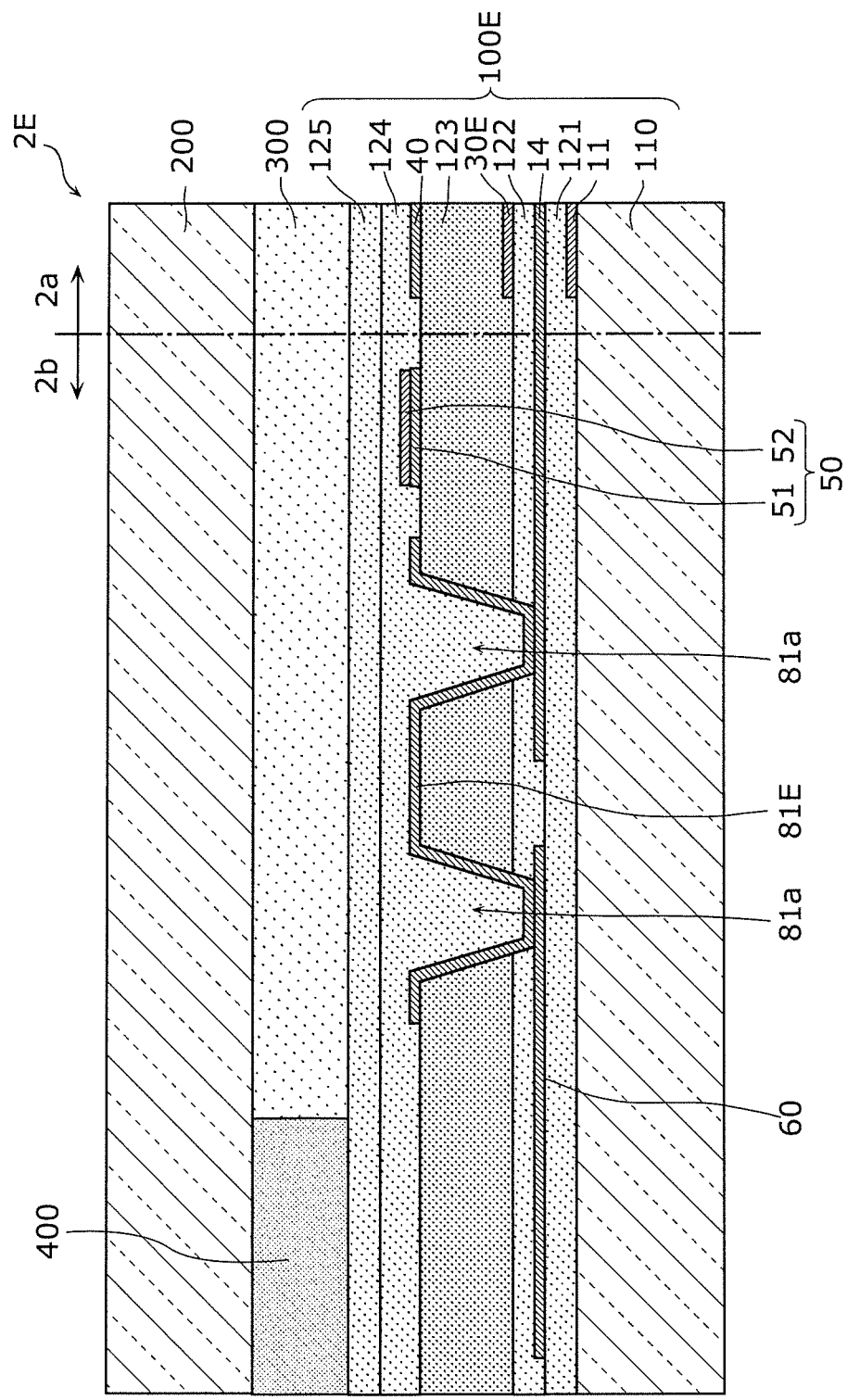
FIG. 14 is a partial sectional view of a display panel according to a fifth variation.

A fifth modification of the exemplary embodiment will be described below with reference to FIG. 14. FIG. 14 is a partially sectional view illustrating display panel 2E according to the fifth modification. FIG. 14 corresponds to the section of display panel 2 in FIG. 5 of the exemplary embodiment.

In display panel 2 and TFT substrate 100 of the exemplary embodiment, pixel electrode 30 is located above common electrode 40. On the other hand, in display panel 2E and TFT substrate 100E of the fifth modification, pixel electrode 30E is located below common electrode 40. That is, common electrode 40 is located above pixel electrode 30E. Specifically, while common electrode 40 is formed on third insulating film 123 similarly to the exemplary embodiment, pixel electrode 30E is formed on not fourth insulating film 124 but on second insulating film 122.

In the fifth modification, first connection wiring 81E that connects dummy gate lead-out line 14 and shield electrode 60 is formed in the same layer as common electrode 40. Thus, first connection wiring 81E is made of the same material as common electrode 40.

As described above, when first connection wiring 81E connecting dummy gate lead-out line 14 and shield electrode 60 is formed in the same layer as common electrode 40, first contact hole 81a is made so as to pierce second insulating film 122 and third insulating film 123.

In the fifth modification, other configurations are the same as display panel 2 and TFT substrate 100 of the exemplary embodiment.

As described above, even in display panel 2E and TFT substrate 100E of the fifth modification, similarly to display panel 2 and TFT substrate 100 of the exemplary embodiment, the common potential is applied to the plurality of dummy gate lead-out lines 14 using shield electrode 60 and common bus wiring 50 to which the common potential is applied. Consequently, the flexibility of the wiring layout of various wirings such as gate lead-out line 13 and source signal line 12 can be prevented from decreasing, and display panel 2A and TFT substrate 100A having the high flexibility of the wiring layout can be constructed.

Figure 15:
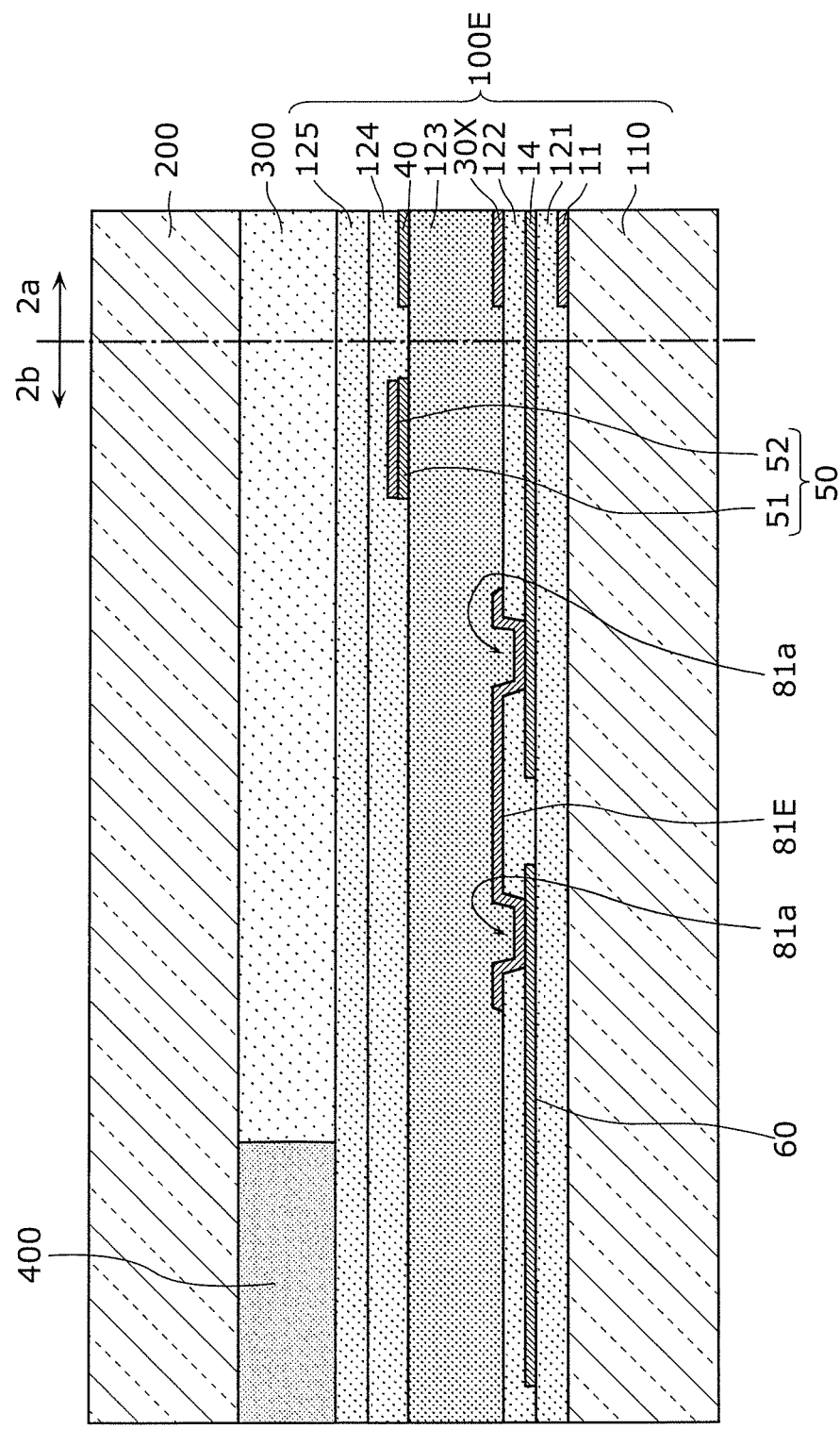
FIG. 15 is a view illustrating another configuration of an image display panel of the fifth exemplary embodiment.

As illustrated in FIG. 15, in the fifth modification, first connection wiring 81E may be formed in the same layer as pixel electrode 30X. Consequently, first connection wiring 81E can be formed in a predetermined shape at the same time as a process of patterning pixel electrode 30X. That is, first connection wiring 81E and pixel electrode 30X can be formed through the same process.

(Sixth Modification)

Figure 16:
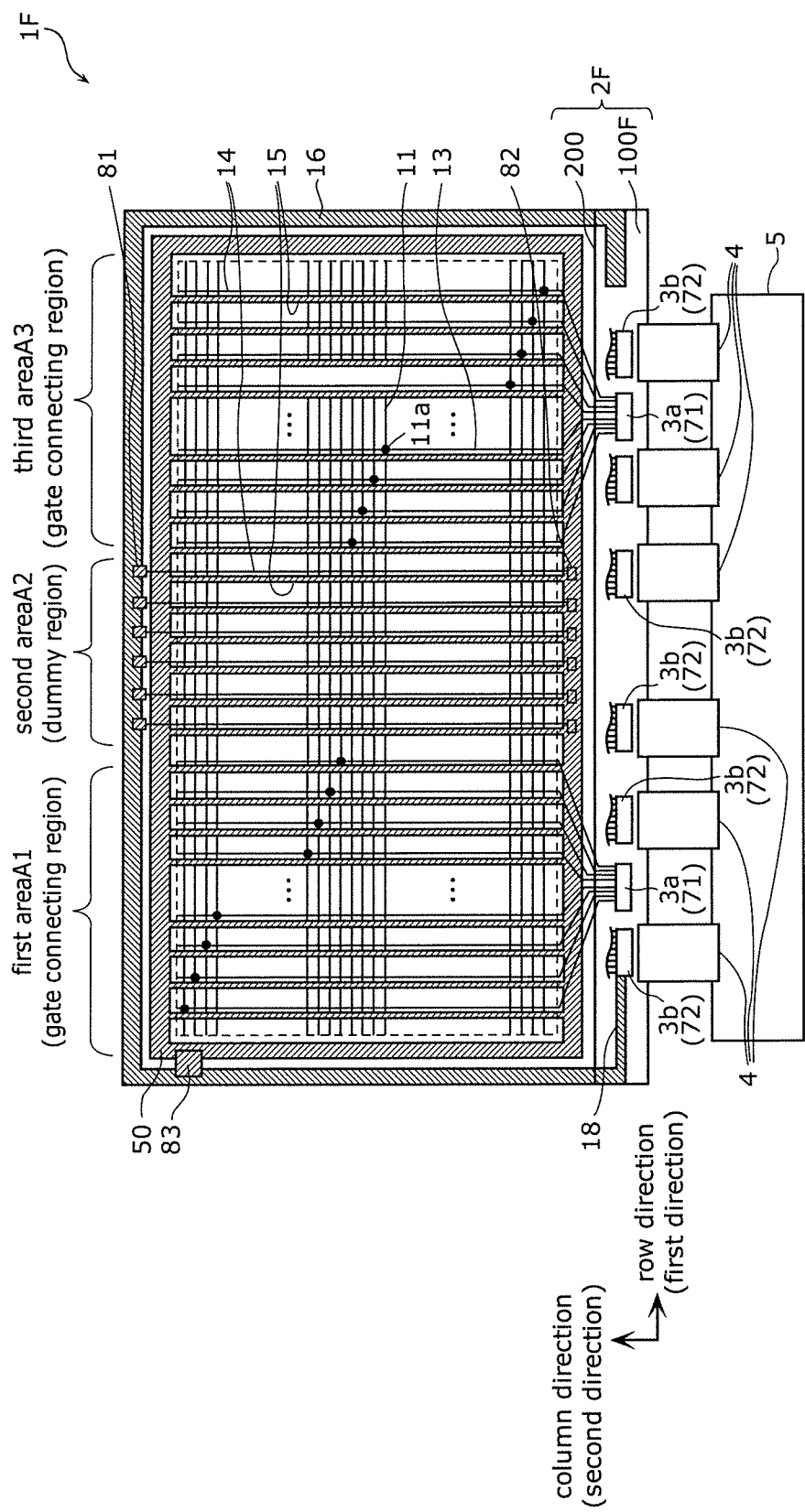
FIG. 16 is a view illustrating a configuration of an image display panel of a sixth exemplary embodiment.

A sixth modification of the exemplary embodiment will be described below with reference to FIG. 16. FIG. 16 is a plan view illustrating a schematic configuration of image display device 1F and display panel 2F according to the sixth modification. In the sixth modification, the configuration except for the region where gate lead-out line 13 and dummy gate lead-out line 14 are formed is the same as the exemplary embodiment.

In display panel 2 and TFT substrate 100 of the exemplary embodiment, the plurality of gate lead-out lines 13 are formed in second region A2, and the plurality of dummy gate lead-out lines 14 are formed in each of first region A1 and third region A3. On the other hand, in display panel 2F and TFT substrate 100F of the sixth modification, the plurality of gate lead-out lines 13 are formed in each of first region A1 and third region A3, and dummy gate lead-out line 14 is formed in second region A2.

That is, in the sixth modification, first region A1 and third region A3 constitute the gate connection region, and only gate lead-out line 13 among gate lead-out line 13 and dummy gate lead-out line 14 is formed in first region A1 and third region A3. On the other hand, only dummy gate lead-out line 14 among gate lead-out line 13 and dummy gate lead-out line 14 is formed in second region A2, and second region A2 constitutes a dummy region.

Specifically, the plurality of gate lead-out lines 13 include a plurality of first gate lead-out lines connected to a first gate driver of two gate drivers 3a disposed with a space in the row direction and a plurality of second gate lead-out lines connected to a second gate driver of two gate drivers 3a. The plurality of first gate lead-out lines are disposed in first region A1, the plurality of second gate lead-out lines are disposed in third region A3, and the plurality of dummy gate lead-out lines 14 are disposed in second region A2.

As described above, in display panel 2F and TFT substrate 100F of the sixth modification, similarly to display panel 2 and TFT substrate 100 of the exemplary embodiment, the region where gate lead-out line 13 is formed and the region where dummy gate lead-out line 14 is formed are divided from each other. Consequently, the flexibility of the wiring layout of various wirings such as gate lead-out line 13 and source signal line 12 can be prevented from decreasing, and display panel 2A and TFT substrate 100A having the high flexibility of the wiring layout can be constructed.

(Seventh Modification)

Figure 17:
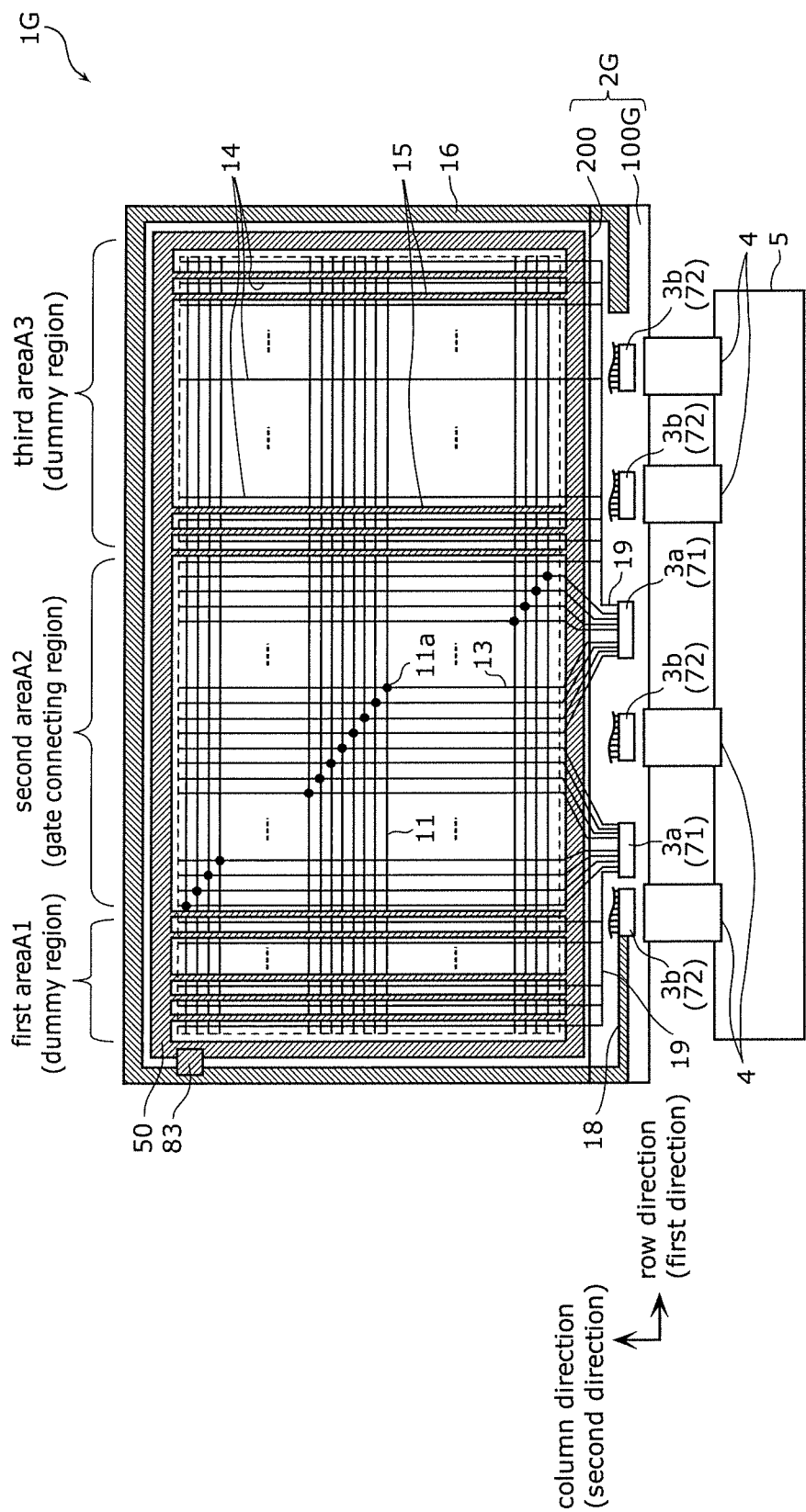
FIG. 17 is a view illustrating a configuration of an image display panel of a seventh exemplary embodiment.
Figure 18:
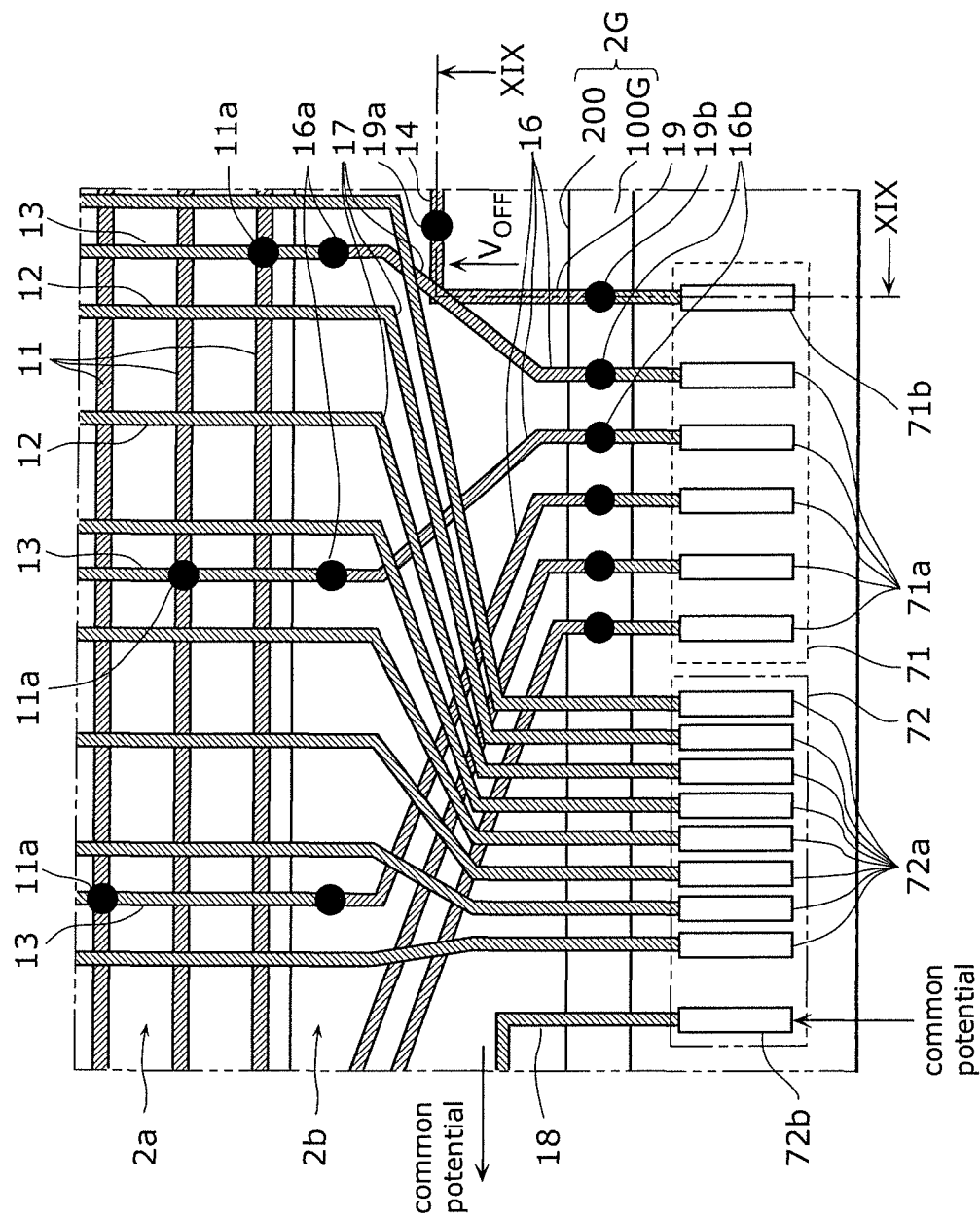
FIG. 18 is a plan view illustrating a configuration around a gate terminal and a source terminal in the display panel of the exemplary embodiment.
Figure 19:
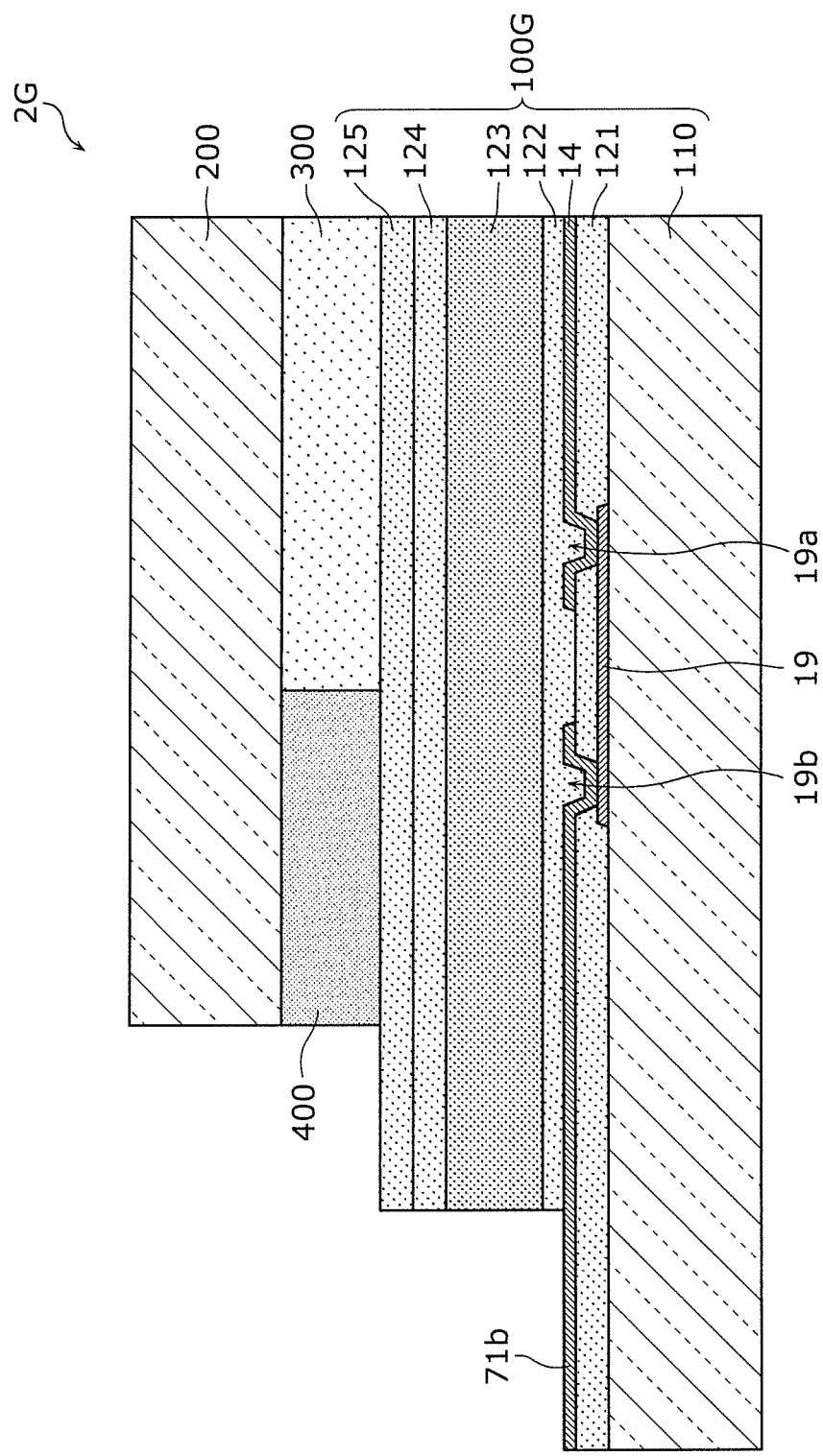
FIG. 19 is a partial sectional view of the display panel taken along line XIX-XIX in FIG. 18.

A seventh modification of the exemplary embodiment will be described below with reference to FIGS. 17 to 19. FIG. 17 is a plan view illustrating a schematic configuration of image display device 1G and display panel 2G according to the seventh modification. FIG. 18 is a plan view illustrating a configuration around gate terminal 71 and source terminal 72 in display panel 2G of the seventh modification. FIG. 19 is a sectional view taken along line XIX-XIX in FIG. 18.

In display panel 2 of the exemplary embodiment, the common potential is applied to dummy gate lead-out line 14. However the present disclosure is not limited to the exemplary embodiment. Specifically, in display panel 2 of the exemplary embodiment, the common potential applied from common terminal electrode 72b to shield electrode 60 or common bus wiring 50 through common relay wiring 18 is applied to dummy gate lead-out line 14.

On the other hand, in display panel 2G and TFT substrate 100G of the seventh modification, off-voltage $V_{OFF}$ turning off the gate of TFT 20 is applied to the plurality of dummy gate lead-out lines 14 such that a predetermined potential is applied to the plurality of dummy gate lead-out lines 14.

Specifically, in the seventh modification, gate terminal 71 includes dummy gate terminal electrode 71b used to apply the predetermined potential to dummy gate lead-out line 14. Dummy gate relay wiring 19 is provided in a route between dummy gate lead-out line 14 and dummy gate terminal electrode 71b in frame region 2b. Dummy gate relay wiring 19 connects dummy gate lead-out line 14 and dummy gate terminal electrode 71b. That is, dummy gate terminal electrode 71b and dummy gate lead-out line 14 are connected to each other by dummy gate terminal electrode 71b.

The off-voltage $V_{OFF}$ output from gate driver 3a is input to dummy gate terminal electrode 71b. Consequently, the off-voltage $V_{OFF}$ input to dummy gate terminal electrode 71b is applied to dummy gate lead-out line 14 through dummy gate relay wiring 19. Off-voltage $V_{OFF}$ is a constant voltage, and ranges from −7V to −1V as an example. However, off-voltage $V_{OFF}$ is not limited to the range.

As illustrated in FIG. 19, dummy gate relay wiring 19 is formed in the metal layer different from dummy gate lead-out line 14, and connected to dummy gate lead-out line 14 through contact hole 19a. Dummy gate relay wiring 19 is connected to dummy gate terminal electrode 71b through contact hole 19b.

In the exemplary embodiment, dummy gate relay wiring 19 is formed in the same layer as gate signal line 11, and formed in the different layer from source signal line 12. Specifically, dummy gate relay wiring 19 and gate signal line 11 are formed in the same layer as gate electrode GT of TFT 20. Thus, contact holes 19a and 19b are made in first insulating film 121 (gate insulator) between the first metal layer in which dummy gate relay wiring 19 and gate signal line 11 are formed and the second metal layer in which source signal line 12 and dummy gate lead-out line 14 are formed. As described above, dummy gate relay wiring 19 is connected to each of dummy gate lead-out line 14 and dummy gate terminal electrode 71b through contact holes 19a and 19b made in first insulating film 121. Consequently, dummy gate relay wiring 19 and source relay wiring 17 can intersect three-dimensionally with each other.

The method for routing dummy gate relay wiring 19 is not limited to the method in FIG. 19. For example, dummy gate relay wiring 19 may be returned to the original metal layer after being routed to the metal layer in which common electrode 40 or pixel electrode 30 is formed through the contact hole and connected to dummy gate lead-out line 14.

As described above, even in display panel 2G and TFT substrate 100G of the seventh modification, similarly to display panel 2 and TFT substrate 100 of the exemplary embodiment, the region where gate lead-out line 13 is formed and the region where dummy gate lead-out line 14 is formed are divided from each other. Consequently, the flexibility of the wiring layout of various wirings such as gate lead-out line 13 and source signal line 12 can be prevented from decreasing, and display panel 2B and TFT substrate 100B having the high flexibility of the wiring layout can be constructed.

In the seventh modification, dummy gate terminal electrode 71b used to apply a predetermined potential to dummy gate lead-out line 14 is included in gate terminal 71. However, the present disclosure is not limited to the seventh modification. For example, dummy gate terminal electrode 71b may be provided in source terminal 72, or dummy gate terminal electrode 71b may not be included in any of source terminal 72 and gate terminal 71, but may be singly provided in frame region 2b of TFT substrate 100.

(Other Modifications)

The TFT substrate and the display panel of the present disclosure are described above based on the exemplary embodiment, but the present disclosure is not limited to the exemplary embodiment.

For example, in the exemplary embodiment, common bus wiring 50 has the two-layer structure of first layer 51 and second layer 52. However, the present disclosure is not limited to the exemplary embodiment. Specifically, common bus wiring 50 may have a single-layer structure including only one of first layer 51 and second layer 52. In this case, when a part of common bus wiring 50 is used as the first connection wiring or the second connection wiring, the first connection wiring or the second connection wiring is constructed with only one of first layer 51 and second layer 52.

In the exemplary embodiment, pixel region 2a is divided into three column regions of first region A1, second region A2, and third region A3. However, the present disclosure is not limited to the exemplary embodiment. Specifically, pixel region 2a may be divided into at least four column regions.

In the exemplary embodiment, gate signal line 11 is orthogonal to gate lead-out line 13 and source signal line 12 (that is, intersect with one another at 90°) in planar view. However, the present disclosure is not limited to the exemplary embodiment. For example, gate signal line 11 may intersect with gate lead-out line 13 and source signal line 12 at any angle except for 90°.

In the exemplary embodiment, gate driver 3a and source driver 3b are mounted on display panel 2 (TFT substrate 100) by the COG method. However, the present disclosure is not limited to the exemplary embodiment. For example, gate driver 3a and source driver 3b may be mounted on display panel 2 (TFT substrate 100) by the COF method. In this case, when source driver 3b is mounted by the COF method, flexible wiring board 4 on which source driver 3b is mounted may be connected to TFT substrate 100.

In the exemplary embodiment, common terminal electrode 72b to which the common potential is input from power supply circuit 7 is included in source terminal 72. However, the present disclosure is not limited to the exemplary embodiment. For example, common terminal electrode 72b may be included in gate terminal 71. Alternatively, common terminal electrode 72b is included in neither source terminal 72 nor gate terminal 71, but may singly be provided in frame region 2b of TFT substrate 100.

In the exemplary embodiment, the liquid crystal display panel is used as display panel 2. However, the present disclosure is not limited to the exemplary embodiment. For example, display panel 2 may be another display device such as an organic EL panel and an inorganic EL panel. That is, TFT substrate 100 of the exemplary embodiment can also be applied to the organic EL panel and the inorganic EL panel.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A thin film transistor substrate including a pixel region constructed with a plurality of pixels and a frame region surrounding the pixel region, the thin film transistor substrate comprising:
   thin film transistors and pixel electrodes provided in each of the plurality of pixels respectively;
   a plurality of gate signal lines extending in a first direction in the pixel region and supplying a gate signal to the thin film transistors in the plurality of pixels;
   a plurality of gate lead-out lines and a plurality of dummy gate lead-out lines extending in a second direction different from the first direction in the pixel region;
   a plurality of common lines extending in at least one of the first direction and the second direction in the pixel region, a common potential being applied to the plurality of common lines;
   a common electrode provided opposite to the pixel electrode and electrically connected to the plurality of common lines;
   a shield electrode formed in the frame region, the common potential being applied to the shield electrode; and
   a plurality of first connection wirings respectively connecting the plurality of dummy gate lead-out lines and the shield electrode through respective first contact holes made in the frame region, wherein
      the plurality of gate lead-out lines are connected to the plurality of gate signal lines at least at one point of a plurality of intersections between the plurality of gate signal lines and the plurality of gate lead-out lines, and
      the common potential is applied to the plurality of dummy gate lead-out lines.

2. The thin film transistor substrate according to claim 1, further comprising:
   a plurality of source signal lines extending in the second direction in the pixel region and supplying a data signal to the thin film transistors in the plurality of pixels;
   a gate terminal including a plurality of gate terminal electrodes connected to the plurality of gate lead-out lines respectively; and
   a source terminal including a plurality of source terminal electrodes connected to the plurality of source signal lines respectively,
      wherein the gate terminal and the source terminal are provided in one of a pair of long sides in the frame region of the thin film transistor substrate.

3. The thin film transistor substrate according to claim 1, wherein the plurality of first connection wirings are formed in a layer identical to the pixel electrodes.

4. The thin film transistor substrate according to claim 1, wherein the plurality of first connection wirings are formed in a layer identical to the common electrode.

5. The thin film transistor substrate according to claim 1, wherein the plurality of first connection wirings are formed in a layer identical to a source-drain electrode of the thin film transistor.

6. The thin film transistor substrate according to claim 1, wherein the shield electrode is formed in a layer identical to the plurality of dummy gate lead-out lines.

7. The thin film transistor substrate according to claim 1, wherein the shield electrode is formed in a mesh shape.

8. The thin film transistor substrate according to claim 1, wherein for the one first connection wiring, the first contact hole is made in at least two points of the dummy gate lead-out lines and on the shield electrode.

9. The thin film transistor substrate according to claim 1, wherein the first contact hole is made in the other of the pair of long sides.

10. A display panel comprising:
the thin film transistor substrate according to claim 1; and
a counter substrate opposed to the thin film transistor substrate.

* * * * *